United States Patent
Willmot et al.

(10) Patent No.: US 9,826,575 B2
(45) Date of Patent: Nov. 21, 2017

(54) ELECTRICAL RAFT ASSEMBLY

(71) Applicant: ROLLS-ROYCE PLC, London (GB)

(72) Inventors: Michael Christopher Willmot, Sheffield (GB); Paul Broughton, Leicester (GB); Richard Peace, Derby (GB); Gary Alan Skinner, Nottingham (GB); Robin Charles Kennea, Nottingham (GB)

(73) Assignee: ROLLS-ROYCE plc, London (GB)

(*) Notice: Subject to any disclaimer, the term of this patent is extended or adjusted under 35 U.S.C. 154(b) by 770 days.

(21) Appl. No.: 13/716,808

(22) Filed: Dec. 17, 2012

(65) Prior Publication Data

US 2013/0160458 A1    Jun. 27, 2013

(30) Foreign Application Priority Data

Dec. 22, 2011 (GB) .................................. 1122140.5
Dec. 22, 2011 (GB) .................................. 1122143.9
Mar. 7, 2012  (GB) .................................. 1203991.3

(51) Int. Cl.
*H02G 3/03* (2006.01)
*H05B 3/28* (2006.01)
(Continued)

(52) U.S. Cl.
CPC .............. *H05B 3/28* (2013.01); *B23P 6/005* (2013.01); *B60R 16/00* (2013.01); *B60R 16/02* (2013.01); *B60R 16/0207* (2013.01); *B60R 16/0215* (2013.01); *B60R 16/08* (2013.01); *B64C 3/34* (2013.01); *B64D 29/08* (2013.01); *F02C 7/00* (2013.01); *F02C 7/047* (2013.01);
(Continued)

(58) Field of Classification Search
CPC ... F02C 7/12; H02G 3/00; H02G 3/02; H02G 3/03; H02G 3/04; H02G 3/0406; H02G 3/0412; H02G 3/0437; H02G 1/00
See application file for complete search history.

(56) References Cited

U.S. PATENT DOCUMENTS 2,523,083 A  9/1950  Witkowski
2,523,504 A  9/1950  Ford, Jr.
(Continued)

FOREIGN PATENT DOCUMENTS

DE        2941950 B1   2/1981
DE   102009047334 A1   6/2011
(Continued)

OTHER PUBLICATIONS

Apr. 6, 2015 Office Action issued in U.S. Appl. No. 13/716,648.
(Continued)

*Primary Examiner* — William H Rodriguez
*Assistant Examiner* — Thomas Burke
(74) *Attorney, Agent, or Firm* — Oliff PLC

(57) ABSTRACT

An electrical raft assembly for a gas turbine engine is provided. The raft assembly comprises a rigid electrical raft formed of a rigid material that includes an electrical system comprising electrical conductors embedded in the rigid material. The raft assembly further comprises an engine component that is mounted to the electrical raft. The electrical raft includes one or more integral cooling passages which guide a coolant fluid through the raft to cool the engine component.

15 Claims, 12 Drawing Sheets

(51) Int. Cl.

| | | |
|---|---|---|
| F02C 7/12 | (2006.01) | |
| F02C 7/20 | (2006.01) | |
| B23P 6/00 | (2006.01) | |
| H02G 3/04 | (2006.01) | |
| H01R 12/00 | (2006.01) | |
| H02G 3/32 | (2006.01) | |
| B60R 16/02 | (2006.01) | |
| B64C 3/34 | (2006.01) | |
| F02C 7/141 | (2006.01) | |
| B60R 16/08 | (2006.01) | |
| F02C 7/16 | (2006.01) | |
| H01R 12/57 | (2011.01) | |
| H01R 12/59 | (2011.01) | |
| H01R 12/51 | (2011.01) | |
| H01R 12/61 | (2011.01) | |
| H02G 3/00 | (2006.01) | |
| B60R 16/00 | (2006.01) | |
| B64D 29/08 | (2006.01) | |
| F02C 7/00 | (2006.01) | |
| F02C 7/32 | (2006.01) | |
| H02G 1/00 | (2006.01) | |
| H02G 3/02 | (2006.01) | |
| F02C 7/047 | (2006.01) | |
| F02C 7/224 | (2006.01) | |
| F24H 1/10 | (2006.01) | |
| H05B 1/02 | (2006.01) | |
| H05K 7/20 | (2006.01) | |

(52) U.S. Cl.
CPC .............. *F02C 7/12* (2013.01); *F02C 7/141* (2013.01); *F02C 7/16* (2013.01); *F02C 7/20* (2013.01); *F02C 7/224* (2013.01); *F02C 7/32* (2013.01); *F24H 1/105* (2013.01); *H01R 12/00* (2013.01); *H01R 12/51* (2013.01); *H01R 12/515* (2013.01); *H01R 12/57* (2013.01); *H01R 12/59* (2013.01); *H01R 12/592* (2013.01); *H01R 12/61* (2013.01); *H02G 1/00* (2013.01); *H02G 3/00* (2013.01); *H02G 3/02* (2013.01); *H02G 3/04* (2013.01); *H02G 3/32* (2013.01); *H05B 1/0236* (2013.01); *H05K 7/20* (2013.01); *F05D 2260/30* (2013.01); *Y02T 50/672* (2013.01); *Y10T 29/49002* (2015.01); *Y10T 29/49117* (2015.01); *Y10T 29/49234* (2015.01); *Y10T 29/49236* (2015.01); *Y10T 29/49238* (2015.01); *Y10T 156/10* (2015.01)

(56) References Cited

U.S. PATENT DOCUMENTS

| | | | |
|---|---|---|---|
| 2,866,522 A | 12/1958 | Morley | |
| 2,877,544 A | 3/1959 | Gammel | |
| 2,963,538 A | 12/1960 | Dahlgren | |
| 3,086,071 A | 4/1963 | Preston | |
| 3,128,214 A * | 4/1964 | Lay | H01B 7/0045 156/56 |
| 3,168,617 A | 2/1965 | Richter | |
| 3,284,003 A | 11/1966 | Ciemochowski | |
| 3,494,657 A | 2/1970 | Harper et al. | |
| 3,612,744 A | 10/1971 | Thomas | |
| 3,700,825 A | 10/1972 | Taplin et al. | |
| 3,710,568 A | 1/1973 | Rice | |
| 4,137,888 A | 2/1979 | Allan | |
| 4,149,567 A | 4/1979 | Weirich | |
| 4,180,608 A | 12/1979 | Del | |
| 4,220,912 A | 9/1980 | Williams | |
| 4,488,970 A | 12/1984 | Clark | |
| 4,533,787 A | 8/1985 | Anderegg et al. | |
| 4,652,064 A | 3/1987 | Cetrone | |
| 4,671,593 A | 6/1987 | Millon-Fremillon et al. | |
| 4,846,405 A | 7/1989 | Zimmermann | |
| 5,004,639 A | 4/1991 | Desai | |
| 5,012,639 A * | 5/1991 | Ream | B64D 29/00 60/226.1 |
| 5,031,396 A | 7/1991 | Margnelli | |
| 5,048,747 A | 9/1991 | Clark et al. | |
| 5,091,605 A | 2/1992 | Clifford | |
| 5,097,390 A | 3/1992 | Gerrie et al. | |
| 5,138,784 A | 8/1992 | Niwa | |
| 5,142,448 A | 8/1992 | Kober et al. | |
| 5,174,110 A * | 12/1992 | Duesler | F02C 7/32 138/111 |
| 5,249,417 A | 10/1993 | Duesler et al. | |
| 5,435,124 A | 7/1995 | Sadil et al. | |
| 5,509,599 A | 4/1996 | Laue | |
| 5,688,145 A | 11/1997 | Liu | |
| 5,691,509 A | 11/1997 | Balzano | |
| 5,692,909 A | 12/1997 | Gadzinski | |
| 5,795,172 A | 8/1998 | Shahriari et al. | |
| 5,870,824 A | 2/1999 | Lilja et al. | |
| 5,876,013 A | 3/1999 | Ott | |
| 5,885,111 A | 3/1999 | Yu | |
| 5,895,889 A | 4/1999 | Uchida et al. | |
| 6,050,853 A | 4/2000 | Ando et al. | |
| 6,148,500 A | 11/2000 | Krone et al. | |
| 6,157,542 A | 12/2000 | Wu | |
| 6,328,010 B1 | 12/2001 | Thurman | |
| 6,344,616 B1 | 2/2002 | Yokokawa | |
| 6,399,889 B1 | 6/2002 | Korkowski et al. | |
| 6,434,473 B1 | 8/2002 | Hattori | |
| 6,481,101 B2 | 11/2002 | Reichinger | |
| 6,588,820 B2 | 7/2003 | Rice | |
| 6,689,446 B2 | 2/2004 | Barnes et al. | |
| 6,702,607 B2 | 3/2004 | Kondo | |
| 6,849,805 B2 | 2/2005 | Honda et al. | |
| 6,969,807 B1 | 11/2005 | Lin et al. | |
| 6,971,650 B2 | 12/2005 | Marelja | |
| 6,971,841 B2 | 12/2005 | Care | |
| 7,002,269 B2 | 2/2006 | Angerpointer | |
| 7,010,906 B2 | 3/2006 | Cazenave et al. | |
| 7,232,315 B2 | 6/2007 | Uchida et al. | |
| 7,281,318 B2 | 10/2007 | Marshall et al. | |
| 7,316,390 B2 | 1/2008 | Burlison | |
| 7,389,977 B1 | 6/2008 | Fernandez et al. | |
| 7,414,189 B2 | 8/2008 | Griess | |
| 7,500,644 B2 | 3/2009 | Naudet et al. | |
| 7,506,499 B2 | 3/2009 | Fert et al. | |
| 7,516,621 B2 | 4/2009 | Suttie et al. | |
| 7,525,816 B2 | 4/2009 | Sawachi | |
| 7,543,442 B2 | 6/2009 | Derenes et al. | |
| 7,592,546 B2 | 9/2009 | Johansson | |
| 7,661,272 B2 | 2/2010 | Gagneux et al. | |
| 7,719,378 B2 | 5/2010 | Blair et al. | |
| 7,745,730 B2 | 6/2010 | Bailey | |
| 7,762,502 B2 | 7/2010 | Mesing et al. | |
| 7,837,497 B1 | 11/2010 | Matsuo et al. | |
| 7,862,348 B2 | 1/2011 | Strauss | |
| 8,038,104 B1 | 10/2011 | Larkin | |
| 8,137,524 B2 | 3/2012 | Berggren et al. | |
| 8,317,524 B2 | 11/2012 | Bailey | |
| 8,491,013 B2 | 7/2013 | Peer et al. | |
| 8,581,103 B2 | 11/2013 | Aspas Puertolas | |
| 8,794,584 B2 | 8/2014 | Shimada et al. | |
| 8,932,066 B2 | 1/2015 | Broughton | |
| 8,937,254 B2 | 1/2015 | Wen et al. | |
| 9,010,716 B2 | 4/2015 | Kobori | |
| 9,040,821 B2 | 5/2015 | Blanchard et al. | |
| 9,139,144 B2 | 9/2015 | Broughton | |
| 9,259,808 B2 | 2/2016 | Broughton et al. | |
| 9,338,830 B2 | 5/2016 | Broughton et al. | |
| 9,456,472 B2 | 9/2016 | Dalton et al. | |
| 2002/0046870 A1 | 4/2002 | Zein et al. | |
| 2002/0084382 A1 | 7/2002 | Crist | |
| 2002/0086586 A1 | 7/2002 | Shi et al. | |
| 2002/0170729 A1 | 11/2002 | Murakami et al. | |
| 2002/0170740 A1 | 11/2002 | Yamanobe et al. | |
| 2003/0095389 A1 | 5/2003 | Samant et al. | |

(56) References Cited

U.S. PATENT DOCUMENTS

| | | |
|---|---|---|
| 2003/0155467 A1 | 8/2003 | Petrenko |
| 2003/0183733 A1 | 10/2003 | Pisczak |
| 2004/0065092 A1 | 4/2004 | Wadia et al. |
| 2004/0266266 A1 | 12/2004 | Lai |
| 2004/0266274 A1 | 12/2004 | Naudet et al. |
| 2005/0257956 A1 | 11/2005 | Marshall et al. |
| 2006/0272340 A1 | 12/2006 | Petrenko |
| 2006/0278423 A1 | 12/2006 | Ichikawa et al. |
| 2007/0018057 A1 | 1/2007 | Kovac |
| 2007/0029454 A1 | 2/2007 | Suttie et al. |
| 2007/0084216 A1 | 4/2007 | Mazeaud et al. |
| 2007/0129902 A1 | 6/2007 | Orbell |
| 2007/0170312 A1 | 7/2007 | Al-Khalil |
| 2007/0234559 A1 | 10/2007 | Tokuda et al. |
| 2008/0128048 A1 | 6/2008 | Johnson et al. |
| 2008/0179448 A1 | 7/2008 | Layland et al. |
| 2008/0185478 A1 | 8/2008 | Dannenberg |
| 2008/0245932 A1 | 10/2008 | Prellwitz et al. |
| 2009/0067979 A1 | 3/2009 | Braley et al. |
| 2009/0072091 A1 | 3/2009 | Al-Khalil |
| 2009/0095842 A1 | 4/2009 | Gaertner, II et al. |
| 2009/0134272 A1 | 5/2009 | Vauchel |
| 2009/0189051 A1 | 7/2009 | Love |
| 2009/0230650 A1 | 9/2009 | Mayen et al. |
| 2009/0242703 A1 | 10/2009 | Alexander et al. |
| 2009/0277578 A1 | 11/2009 | Sung et al. |
| 2009/0289232 A1 | 11/2009 | Rice |
| 2010/0162726 A1 | 7/2010 | Robertson et al. |
| 2010/0261365 A1 | 10/2010 | Sakakura |
| 2010/0293987 A1 | 11/2010 | Horst et al. |
| 2010/0308169 A1 | 12/2010 | Blanchard et al. |
| 2011/0011627 A1 | 1/2011 | Aspas Puertolas |
| 2011/0014803 A1 | 1/2011 | Bailey |
| 2011/0016882 A1 | 1/2011 | Woelke et al. |
| 2011/0017879 A1 | 1/2011 | Woelke et al. |
| 2011/0053468 A1 | 3/2011 | Vontell |
| 2011/0056961 A1 | 3/2011 | Amtmann et al. |
| 2011/0111616 A1 | 5/2011 | Chang et al. |
| 2011/0120748 A1 | 5/2011 | Bailey |
| 2011/0236182 A1 | 9/2011 | Wiebe et al. |
| 2011/0271655 A1* | 11/2011 | Poisson .............. H05K 7/20872 60/39.83 |
| 2011/0315830 A1 | 12/2011 | Eshima et al. |
| 2012/0012710 A1 | 1/2012 | Yamaguchi et al. |
| 2012/0103685 A1* | 5/2012 | Blanchard ............ H02G 3/0431 174/72 A |
| 2012/0111614 A1 | 5/2012 | Free |
| 2012/0149232 A1 | 6/2012 | Balzano |
| 2012/0312022 A1 | 12/2012 | Lam et al. |
| 2013/0048344 A1 | 2/2013 | Lou |
| 2013/0092434 A1 | 4/2013 | Kato et al. |
| 2013/0160458 A1 | 6/2013 | Willmot et al. |
| 2013/0160460 A1 | 6/2013 | Dalton et al. |
| 2013/0160464 A1 | 6/2013 | Maszczk et al. |
| 2013/0189868 A1 | 7/2013 | Fitt et al. |
| 2013/0316147 A1 | 11/2013 | Douglas et al. |
| 2014/0208712 A1 | 7/2014 | Dowdell |
| 2014/0208770 A1 | 7/2014 | Fitt et al. |
| 2014/0290271 A1 | 10/2014 | Dalton |
| 2014/0305134 A1 | 10/2014 | Amarasinghe et al. |
| 2014/0305136 A1 | 10/2014 | Taylor |
| 2014/0325992 A1 | 11/2014 | Summerfield |
| 2014/0325993 A1 | 11/2014 | Broughton et al. |
| 2014/0325994 A1 | 11/2014 | Dowdell et al. |
| 2014/0326058 A1 | 11/2014 | Broughton |
| 2014/0327299 A1 | 11/2014 | Broughton et al. |
| 2014/0328030 A1 | 11/2014 | Broughton |
| 2015/0342022 A1 | 11/2015 | Willmot et al. |
| 2016/0056578 A1 | 2/2016 | Taylor |
| 2016/0057873 A1 | 2/2016 | Richardson et al. |
| 2016/0069213 A1 | 3/2016 | Fitt et al. |
| 2016/0072210 A1 | 3/2016 | Armstrong et al. |
| 2016/0096288 A1 | 4/2016 | Dowdell |

FOREIGN PATENT DOCUMENTS

| | | |
|---|---|---|
| EP | 1741879 A1 | 1/2007 |
| EP | 1 760 291 A2 | 3/2007 |
| EP | 1 762 714 A2 | 3/2007 |
| EP | 2279852 A1 | 2/2011 |
| EP | 2 590 270 A2 | 5/2013 |
| FR | 2871284 A1 | 12/2005 |
| GB | 1260339 A | 1/1972 |
| GB | 2152147 A | 7/1985 |
| GB | 2477337 A | 8/2011 |
| JP | A-63-285808 | 11/1988 |
| JP | A-4-167376 | 6/1992 |
| JP | A-4-223067 | 8/1992 |
| JP | A-5-129040 | 5/1993 |
| JP | A-2000-299151 | 10/2000 |
| WO | 0210587 A1 | 2/2002 |
| WO | 2009/118561 A1 | 10/2009 |
| WO | WO 2010/075390 A2 | 7/2010 |
| WO | WO 2011/061074 A1 | 5/2011 |
| WO | WO 2011/117609 | 9/2011 |
| WO | WO 2011/127996 A1 | 10/2011 |

OTHER PUBLICATIONS

Jun. 5, 2015 Office Action issued in U.S. Appl. No. 13/716,708.
Jun. 12, 2015 Office Action issued in U.S. Appl. No. 13/716,254.
Nellis and Klein, "Heat Transfer", 2009, Campridge University, pp. 748-751.
Jun. 19, 2015 Office Action issued in U.S. Appl. No. 13/716,244.
Jul. 29, 2015 Office Action issued in U.S. Appl. No. 13/716,648.
Jul. 17, 2015 Office Action issued in U.S. Appl. No. 13/716,497.
Jul. 28, 2015 Office Action issued in U.S. Appl. No. 13/716,796.
Aug. 13, 2015 Office Action issued in U.S. Appl. No. 13/716,516.
Aug. 14, 2015 Office Action issued in U.S. Appl. No. 13/716,239.
Aug. 27, 2015 Office Action issued in U.S. Appl. No. 13/792,851.
Sep. 4, 2015 Office Action issued in U.S. Appl. No. 13/716,503.
Oct. 7, 2015 Office Action issued in U.S. Appl. No. 13/716,587.
Aug. 15, 2014 Office Action issued in U.S. Appl. No. 13/716,497.
Nov. 10, 2014 Office Action issued in U.S. Appl. No. 13/716,300.
Nov. 20, 2014 Office Action issued in U.S. Appl. No. 13/716,648.
Feb. 25, 2015 Office Action issued in U.S. Appl. No. 13/716,497.
Mar. 11, 2015 Office Action issued in U.S. Appl. No. 13/716,300.
Apr. 20, 2012 Search Report issued in British Patent Application No. GB1122140.5.
Apr. 19, 2012 Search Report issued in British Patent Application No. GB1122143.9.
Jun. 21, 2012 Search Report issued in British Patent Application No. GB1203991.3.
Jul. 31, 2012 Search Report issued in British Patent Application No. GB1207733.5.
Aug. 7, 2012 Search Report issued in British Patent Application No. GB1207735.0.
Oct. 23, 2012 Search Report issued in British Patent Application No. GB1212221.4.
Nov. 7, 2012 Search Report issued in British Patent Application No. GB1212223.0.
Broughton et al., Pending U.S. Appl. No. 13/716,648, filed Dec. 17, 2012.
Broughton et al., Pending U.S. Appl. No. 13/716,439, filed Dec. 17, 2012.
Broughton et al., Pending U.S. Appl. No. 13/716,254, filed Dec. 17, 2012.
Willmot et al., Pending U.S. Appl. No. 13/716,300, filed Dec. 17, 2012.
Willmot et al., Pending U.S. Appl. No. 13/716,239, filed Dec. 17, 2012.
Broughton et al., Pending U.S. Appl. No. 13/716,587, filed Dec. 17, 2012.
Maszczk et al., Pending U.S. Appl. No. 13/716,796, filed Dec. 17, 2012.
Broughton et al., Pending U.S. Appl. No. 13/716,497, filed Dec. 17, 2012.
Broughton et al., U.S. Appl. No. 13/716,708, filed Dec. 17, 2012.

(56) References Cited

OTHER PUBLICATIONS

Dalton et al., Pending U.S. Appl. No. 13/716,244, filed Dec. 17, 2012.
Broughton et al., U.S. Appl. No. 13/716,503, filed Dec. 17, 2012.
Broughton et al., Pending U.S. Appl. No. 13/716,516, filed Dec. 17, 2012.
Fitt et al., Pending U.S. Appl. No. 13/792,851, filed Mar. 11, 2013.
Apr. 23, 2014 European Search Report issued in European Patent Application No. 12 19 7402.
Apr. 24, 2014 European Search Report issued in European Patent Application No. 13 19 5848.
Aug. 5, 2013 Search Report issued in British Patent Application No. 1308033.8.
Oct. 25, 2013 European Search Report issued in European Patent Application No. 13 15 8531.
Broughton et al., U.S. Appl. No. 14/100,745, filed Dec. 9, 2013.
Oct. 29, 2015 Office Action issued in Chinese Application No. 201210599254.0.
Feb. 16, 2016 Office Action issued in U.S. Appl. No. 13/716,503.
Jun. 10, 2016 Office Action Issued in U.S. Appl. No. 13/716,503.
Apr. 7, 2016 Office Action issued in U.S. Appl. No. 13/716,587.
Apr. 8, 2016 Office Action issued in U.S. Appl. No. 13/716,497.
Apr. 22, 2016 Office Action issued in U.S. Appl. No. 14/100,745.
Dec. 2, 2016 U.S. Office Action Issued in U.S. Appl. No. 13/716,503.
Translation dated Oct. 12, 2016 Office Action issued in Russian Patent Application No. 2012154565.
Sep. 23, 2016 Office Action Issued in U.S. Appl. No. 13/716,497.
Sep. 15, 2016 Office Action Issued in U.S. Appl. No. 13/716,587.
Oct. 28, 2016 Office Action Issued in U.S. Appl. No. 14/100,745.
Apr. 10, 2017 Search Report issued in European Patent Application No. 12197394.
Feb. 2, 2017 Office Action issued in U.S. Appl. No. 13/716,587.
Sep. 8, 2017 Search Report issued in European Patent Application No. 12197391.
Jul. 28, 2017 Office Action issued in U.S. Appl. No. 13/716,497.

* cited by examiner

ELECTRICAL RAFT ASSEMBLY

CROSS-REFERENCE TO RELATED APPLICATIONS

This application is based upon and claims the benefit of priority from British Patent Application Number 1122140.5 filed 22 Dec. 2011, British Patent Application Number 1122143.9 filed 22 Dec. 2011, and British Patent Application Number 1203991.3 filed 7 Mar. 2012, the entire contents of all of which are incorporated by reference.

BACKGROUND OF THE INVENTION

1. Field of the Invention

The present invention relates to an electrical raft assembly for a gas turbine engine.

2. Description of the Related Art

A typical gas turbine engine has a substantial number of electrical components which serve, for example, to sense operating parameters of the engine and/or to control actuators which operate devices in the engine. Such devices may, for example, control fuel flow, variable vanes and air bleed valves. The actuators may themselves be electrically powered, although some may be pneumatically or hydraulically powered, but controlled by electrical signals.

Electrical power, and signals to and from the individual electrical components, is commonly transmitted along conductors. Conventionally, such conductors may be in the form of wires and/or cables which are assembled together in a harness. In such a conventional harness, each wire may be surrounded by an insulating sleeve, which may be braided or have a braided cover.

By way of example, FIG. 1 of the accompanying drawings shows a typical gas turbine engine including two conventional wiring harnesses 102, 104, each provided with a respective connector component 106, 108 for connection to circuitry, which may be for example accommodated within the airframe of an aircraft in which the engine is installed.

The harnesses 102, 104 are assembled from individual wires and cables which are held together over at least part of their lengths by suitable sleeving and/or braiding. Individual wires and cables, for example those indicated at 110, emerge from the sleeving or braiding to terminate at plug or socket connector components 112 for cooperation with complementary socket or plug connector components 114 on, or connected to, the respective electrical components.

Each conventional harness 102, 104 comprises a multitude of insulated wires and cables. This makes the conventional harness itself bulky, heavy and difficult to manipulate. The conventional harnesses occupy significant space within a gas turbine engine (for example within the nacelle of a gas turbine engine), and thus may compromise the design of the aircraft, for example the size and/or weight and/or shape of the nacelle.

Conventional harnesses comprise a large number of components, including various individual wires and/or bundles of wires, supporting components (such as brackets or cables) and electrical and/or mechanical connectors. This can make the assembly process complicated (and thus susceptible to errors) and/or time consuming. Disassembly of the conventional harnesses (for example removal of the conventional harnesses from a gas turbine engine during maintenance) may also be complicated and/or time consuming. Thus, in many maintenance (or repair or overhaul) procedures on a gas turbine engine, removal and subsequent refitting of the conventional electrical harness may account for a very significant portion of the operation time and/or account for a significant proportion of the potential assembly errors.

The electrical conductors in the conventional harnesses may be susceptible to mechanical damage. For example, mechanical damage may occur during installation (for example through accidental piercing of the protective sleeves/braiding) and/or during service (for example due to vibration). In order to reduce the likelihood of damage to the conductors in a conventional harness, the protective sleeves/braiding may need to be further reinforced, adding still further weight and reducing the ease with which they can be manipulated. Similarly, the exposed electrical connectors used to connect one conductor to another conductor or conductors to electrical units may be susceptible to damage and/or may add significant weight to the engine.

Conventional electrical harnesses tend to be placed in ventilated fire zones and the amount and direction of zone cooling flow is set to ensure that they do not overheat. Cooling air may also be taken from atmosphere or from the bypass duct and directed onto specific units (usually electrical) which need to be kept cool. However, the amount of cooling flow required can be large and intakes on the external nacelle surface and in the bypass duct create pressure losses (drag), which increases engine fuel burn.

OBJECTS AND SUMMARY OF THE INVENTION

In a first aspect, the present invention provides an electrical raft assembly, the raft assembly comprising:
  a rigid electrical raft formed of a rigid material that includes an electrical system comprising electrical conductors embedded in the rigid material, and
  a component that is mounted to the electrical raft;
  wherein the electrical raft includes one or more integral cooling passages which guide a coolant fluid through the raft to cool the engine component.

The electrical raft assembly may be for an engine, such as a gas turbine engine, for example. The component mounted to the electrical raft may be an engine component.

Transferring electrical signals using the embedded electrical conductors of the rigid electrical raft can provide a number of advantages over transferring electrical signals using a conventional harness. For example, during assembly and in use, such electrical rafts may provide greater protection to their electrical conductors than conventional harnesses. Further, the use of such rafts may significantly reduce the build and maintenance times of an engine, and/or reduce the possibility of errors occurring during such procedures. The rafts can also provide weight and size advantages over conventional harnesses.

In addition, the one or more integral cooling passages allow the engine component to be cooled effectively and efficiently. This in turn allows the raft to be deployed in environments which may be unavailable to conventional harnesses, such as engine core zones. Indeed, as well as cooling the engine component, the cooling passages can cool the raft itself.

In a second aspect, the present invention provides a gas turbine engine or gas turbine engine installation, having the electrical raft assembly according to the first aspect mounted thereto. Thus, in the gas turbine engine or gas turbine engine installation, the electrical raft assembly may be part of an electrical system of the gas turbine engine, and the electrical system may further comprise a flexible cable electrically connected between the electrical raft assembly and another component of the electrical system.

In a third aspect, the present invention provides the use of an electrical raft assembly according to the first aspect for cooling the engine component.

In a fourth aspect, the present invention provides the rigid electrical raft of the electrical raft assembly of the first aspect.

Optional features of the invention will now be set out. These are applicable singly or in any combination with any aspect of the invention.

Conveniently, the fluid passages may be formed by the rigid material. The rigid material may be a rigid composite material.

The engine component can be an electrical component and can be electrically connected to the electrical conductors embedded in the rigid material. For example, the electrical component may be an electronic control unit (ECU) such as an electronic engine controller (EEC) or an engine health monitoring unit. The raft may be provided with (for example have embedded therein) an electrical connector/socket that can be connected to a corresponding (or complimentary) connector on an electrical component which may be physically mounted on the rigid material of the rigid raft assembly.

The integral cooling passages may feed the fluid to an array of impingement holes formed in the raft, the fluid exiting the holes as cooling jets which impinge on one or more surfaces of the engine component. For example, the cooling jets may impinge on base and/or on side surfaces of the engine component.

The engine component may have a double-walled housing and the integral cooling passages may feed the fluid into a cavity formed between the two walls of the housing. With a double-walled housing arrangement, it is possible to at least partly surround the component with the coolant fluid. The outer wall of the housing may be at least partly formed by a removably replaceable cover to the compartment, the cover e.g. facilitating access to the component as well as helping to form the cavity. The cavity may have internal walls which guide the fluid on a convoluted route through the cavity. For example, the route can be a multi-pass route with two or more successive reversals in flow direction.

Indeed, more generally, the internal passages can guide the fluid on a convoluted route over a heat-withdrawing surface of the engine component. Again, the route can be a multi-pass route with two or more successive reversals in flow direction, e.g. produced by dividing walls. The cooling air in the convoluted route can be in direct contact with the heat-withdrawing surface of the engine component. Another option, however, is for the heat-withdrawing surface of the engine component to be in intimate, heat-conducting relationship with one side of a wall of the raft, the cooling air in the convoluted route being in direct contact with the other side of the wall to remove heat from the component via the wall.

Conveniently, the cooling passages may be arranged to guide a flow of cooling air. For example, the cooling air can be obtained from an inlet scoop on the outside of the engine nacelle or in the main engine intake, or from engine air bled from the bypass duct or from any of the compressor stages.

The cooling passages may include cooling fins to increase the surface area of the passages and/or cooling passages may include turbulators, such as trip strips, to increase the amount of turbulent flow in the passages.

In general, the use of one or more electrical rafts/electrical raft assemblies may significantly reduce build time of an engine. For example, use of electrical rafts/electrical raft assemblies may significantly reduce the part count involved in engine assembly compared with a conventional harness arrangement. The number and/or complexity of the operations required to assemble an engine (for example to assemble/install the electrical system (or network) and/or other peripheral components, which may be referred to in general as engine dressing) may be reduced. For example, rather than having to install/assemble a great number of wires and/or wiring looms together on the engine installation, it may only be necessary to attach a relatively small number of electrical rafts/electrical raft assemblies, which themselves may be straightforward to handle, position, secure and connect. Thus, use of electrical raft assemblies in a gas turbine installation may reduce assembly time and/or reduce the possibility of errors occurring during assembly.

Use of electrical raft assemblies may provide significant advantages during maintenance, such as repair and overhaul. As discussed above, the electrical rafts may be particularly quick and straightforward to assemble. The same advantages discussed above in relation to assembly apply to disassembly/removal from the gas turbine engine. Thus, any repair/overhaul that requires removal of at least a part of the electrical harness may be simplified and/or speeded up through use of electrical rafts as at least a part of the electrical harness, for example compared with conventional harnesses. Use of electrical rafts (for example as part of one or more electrical raft assemblies) may allow maintenance procedures to be advantageously adapted. For example, some maintenance procedures may only require access to a certain portion of the gas turbine engine that only requires a part of the harness to be removed. It may be difficult and/or time consuming, or not even possible, to only remove the required part of a conventional harness from a gas turbine engine. However, it may be relatively straightforward to only remove the relevant electrical raft, for example by simply disconnecting it from the engine and any other electrical rafts/components to which it is connected. Decreasing maintenance times has the advantage of, for example, reducing out-of service times (for example off-wing times for engines that are used on aircraft).

The build/assembly times may be additionally or alternatively reduced by pre-assembling and/or pre-testing individual and/or combinations of electrical rafts and/or electrical raft assemblies prior to engine assembly. This may allow the electrical and/or mechanical operation of the electrical rafts to be proven before installation, thereby reducing/eliminating the testing required during engine installation.

Accordingly, there is provided (and aspects of the invention may be used with/as a part of) a method of servicing a gas turbine engine, the method comprising: removing a first rigid raft assembly from the gas turbine engine, the rigid raft assembly incorporating at least a part of at least one component or system of the gas turbine engine; and installing a second, pre-prepared, rigid raft assembly onto the gas turbine engine in place of the first raft assembly. The first and second rigid raft assemblies may be electrical raft assemblies having electrical conductors embedded in a rigid material. The electrical conductors may be at least a part of an electrical system arranged to transfer electrical signals around the engine.

The electrical rafts/electrical raft assemblies may be a particularly lightweight solution for transferring electrical signals around an engine. For example, an electrical raft may be lighter, for example significantly lighter, than a conventional harness required to transmit a given number of electrical signals. A plurality of conductors may be embedded in a single electrical raft, whereas in a conventional arrangement a large number of heavy, bulky wires, usually with insulating sleeves, would be required. The reduced weight may be particularly advantageous, for example, when used on gas turbine engines on aircraft.

Electrical rafts may be more easily packaged and/or more compact, for example than conventional harnesses. Indeed, as mentioned above, the electrical rafts can be made into a very wide range of shapes as desired. This may be achieved, for example, by manufacturing the electrical rafts using a mould conforming to the desired shape. As such, each electrical raft may be shaped, for example, to turn through a tighter corner (or smaller bend radius) than a conventional harness. The electrical rafts may thus provide a particularly compact solution for transferring electrical signals around a gas turbine engine. The electrical rafts may be readily shaped to conform to neighbouring components/regions of a gas turbine engine, for example components/regions to which the particular electrical raft assembly is attached, such as a fan casing or a core casing.

The electrical raft(s) may provide improved protection to the electrical conductors during manufacture/assembly of the raft/gas turbine installation, and/or during service/operation/maintenance of the gas turbine engine. This may result in lower maintenance costs, for example due to fewer damaged components requiring replacement/repair and/or due to the possibility of extending time intervals (or service intervals) between inspecting the electrical system, for example compared with a system using only conventional harnesses.

Any suitable material may be used for the rigid material of the electrical raft. For example, the rigid material may be a rigid composite material for example an organic matrix composite. Such a rigid composite material may be particularly stiff and/or lightweight. Thus, a rigid composite raft may be used that has suitable mechanical properties, whilst being thin and lightweight, for example compared with some other materials. The rigid composite material may comprise any suitable combination of resin and fibre as desired for a particular application. For example, any of the resins and/or fibres described herein may be used to produce a rigid composite material for the electrical raft. Any suitable fibres may be used for example carbon fibres, glass fibres, aramid fibres, and/or para-aramid fibres. The fibres may be of any type, such as woven and/or chopped. Any suitable resin may be used, for example epoxy, BMI (bismaleimide), PEEK (polyetheretherketone), PTFE (polytetraflouroethylene), PAEK (polyaryletherketone), polyurethane, and/or polyamides (such as nylon).

In any example of electrical raft or electrical raft assembly, at least one of the electrical conductors embedded in the electrical raft may be an electrically conductive wire. The or each electrically conductive wire may be surrounded by an electrically insulating sleeve.

At least some (for example a plurality) of the electrical conductors may be provided in a flexible printed circuit (FPC). Thus, at least some of the electrical conductors may be provided as electrically conductive tracks in a flexible substrate. The flexible printed circuit may be flexible before being embedded in the rigid material.

Providing the electrical conductors as tracks in a flexible printed circuit may allow the size of the resulting electrical raft to be reduced further and/or substantially minimized. For example, many different electrical conductors may be laid into a flexible printed circuit in close proximity, thereby providing a compact structure. The flexible substrate of a single flexible printed circuit may provide electrical and/or mechanical protection/isolation to a large number of electrical conductors.

Any given electrical raft may be provided with one or more electrical wires embedded therein (which may be sheathed) and/or one or more flexible printed circuits embedded therein. As such, a given electrical raft may have wires and flexible printed circuits laid therein.

It will be appreciated that the embedded electrical conductors (whether they are provided as embedded electrical wires or as conductive tracks in a flexible printed circuit embedded in the rigid material) may be described as being fixed in position by the rigid material, for example relative to the rest of the electrical harness raft. It will also be appreciated that the embedded electrical conductors may be said to be surrounded by the rigid material and/or buried in the rigid material and/or integral with (or integrated into) the rigid material.

The electrical raft (or electrical raft assembly) may be at least a part of an electrical harness for a gas turbine engine, and thus may be referred to herein as an electrical harness raft (or electrical harness raft assembly).

An electrical raft (or electrical raft assembly) may comprise a fluid passage. Such a fluid passage may be embedded therein and/or otherwise provided thereto. The fluid passage may be part of a fluid system, such as a gas (for example pneumatic or cooling gas/air) and/or liquid (for example a fuel, hydraulic and/or lubricant liquid).

Accordingly, there is provided (and aspects of the invention may be used with/as a part of) a rigid raft assembly for a gas turbine engine, the rigid raft assembly comprising a rigid material that carries at least a part of a first gas turbine engine system and at least a part of a second gas turbine engine system, wherein: the first gas turbine engine system is a fluid system that comprises at least one fluid passage that is at least partially embedded in the rigid raft assembly. The second gas turbine engine system may be an electrical system that comprises electrical conductors at least partially embedded in the rigid material.

There is also provided a method of assembling an electrical raft assembly and/or a gas turbine engine. The method comprises preparing an electrical raft assembly as described above and elsewhere herein. The method also comprises electrically and mechanically connecting the prepared electrical raft assembly to the rest of the apparatus/gas turbine engine.

Thus, there is provided a gas turbine engine or gas turbine engine installation (for example for an airframe) comprising an electrical raft and/or an electrical raft assembly as described above and elsewhere herein. For example, at least one electrical raft and/or electrical raft assembly may be used as part of an electrical harness for transferring electrical signals around the engine, in the form of electrical harness raft(s) and/or electrical harness raft assemblies.

The electrical raft may comprise one or more electrical connectors or sockets, which may be electrically connected to at least one of the embedded electrical conductors. The electrical connector or socket may allow electrical connection of the electrical raft to other electrical components, for example to other electrical rafts (either directly or indirectly, via an electrical cable or lead) or to electrical units (again, either directly or indirectly, via an electrical cable or lead). Such an electrical connector or socket may take any suitable form, and may be at least partially embedded in the rigid electrical raft.

The electrical raft assembly may be a first engine installation component, and the gas turbine engine may further comprise a second engine installation component having electrical conductors. The first and second engine installation components may be a part of an electrical system arranged to transfer electrical signals around the gas turbine engine. The gas turbine engine may further comprise at least one flexible cable connected between the electrical raft assembly and the second engine installation component so as to electrically connect electrical conductors of the electrical raft assembly with electrical conductors of the second engine installation component.

The second engine installation component may be, for example, an ECU, such as an EMU or EEC. Additionally or alternatively, the second engine installation component may be a further electrical raft or electrical raft assembly.

The environment of a gas turbine engine during operation may be particularly severe, with, for example, high levels of vibration and/or differential expansion between components as the temperature changes through operation and as the components move relative to each other. Providing at least one flexible cable to connect an electrical raft assembly to another component may allow the electrical rafts and/or components to accommodate vibration and/or relative movement, for example of the component(s)/assemblies to which they are attached/mounted during use. For example, the flexible cable(s) (where present) used to electrically connect electrical raft assemblies to other component(s) may have sufficient length to accommodate such vibration and/or movement during use.

For example, providing separate (for example more than one) electrical raft assemblies and connecting at least some (for example at least two) of them together using at least one flexible cable may allow the electrical rafts to accommodate vibration and/or relative movement of the component(s)/assemblies to which they are attached/mounted during use.

The electrical signals transferred by the conductors in the electrical raft, and around the engine using the electrical rafts/raft assemblies may take any form. For example, the electrical signals may include, by way of non-limitative example, electrical power and/or electrical control/communication signals and/or any other type of transmission through an electrical conductor. Transmission of signals around the engine may mean transmission of signals between (to and/or from) any number of components/systems in the engine and/or components/system of a structure (such as an airframe) to which the gas turbine engine is (or is configured to be) connected/installed in. In other words, an electrical raft may be used to transfer/communicate any possible combination of electrical signals in any part of a gas turbine engine installation or a related (for example electrically and/or mechanically connected) structure/component/system.

An electrical raft or raft assembly may be provided in any suitable location/position of the gas turbine engine, for example to a mounting structure at any suitable location. For example, the gas turbine engine may comprise a bypass flow duct formed between an engine core and an engine fan casing (the gas turbine engine may be a turbofan engine, for example); and the electrical raft assembly may form at least a part of a radially extending splitter (which may be referred to as a bifurcation) that extends across the bypass flow duct. In this way, an electrical raft (which may be referred to as a splitter electrical raft) may provide an electrical connection between a fan casing and an engine core. By way of further example, the electrical raft assembly may be attached to the engine core case or engine fan case, for example to a mounting structure on such cases.

Other components/systems of a gas turbine engine may be provided to an electrical raft assembly in any suitable manner. For example, such other components/systems may be mounted on one or more electrical raft assemblies. Thus, a surface of an electrical harness raft may be used as a mounting surface for other gas turbine engine components/systems, such as ancillary/auxiliary components/systems.

For example, an electrical unit may be mounted on an electrical raft, which may be, or be in addition to, the cooled engine component. The electrical unit may be any sort of electrical unit, for example one that may be provided to a gas turbine engine. For example, the electrical unit may be any type of electronic control unit (ECU), such as an Electronic Engine Controller (EEC) and an Engine Health Monitoring Unit (EMU). At least one (i.e. one or more) electrical unit may be attached to an electrical raft. Such an electrical raft assembly may be a particularly convenient, lightweight and/or compact way of providing (for example attaching, fixing or mounting) an electrical unit to a turbine engine. For example, the electrical unit and the electrical raft may be assembled together (mechanically and/or electrically) before being installed on the gas turbine engine, as described elsewhere herein.

An electrical raft may be provided with at least one mount on which other components (for example auxiliary/ancillary components/systems), for example of a gas turbine engine are (or may be) mounted. The mount may be a bracket, for example a bespoke bracket for the component/system mounted thereon or a conventional/standard bracket. The electrical raft may provide a stable, regular and convenient platform on which to mount the various systems/components. The combination of the installed electrical raft assembly with components/systems mounted thereon may be much more compact and/or straightforward to assemble and/or have a greatly reduced number of component parts, for example compared with the corresponding conventional electrical harness and separately mounted components/systems.

The mounts may be used to attach any component/system to an electrical raft (and thus to the engine) as required. For example, fluid pipes for transferring fluid around the engine may be mounted to the electrical rafts (for example mechanically mounted using a bracket), and thus to the engine. More than one set of fluid pipes, for example for carrying different or the same fluids, may be mounted on the same electrical raft.

An anti-vibration mount may be used to attach an electrical raft to another component, thereby allowing the electrical raft to be vibration isolated (or at least substantially vibration isolated). Using an anti-vibration mount to attach an electrical raft/assembly to a gas turbine engine for example may reduce (or substantially eliminate) the amount (for example the amplitude and/or the number/range of frequencies) of vibration being passed to the electrical raft from the gas turbine engine, for example during use. This may help to prolong the life of the electrical raft. Furthermore, any other components that may be attached to the electrical raft (as discussed above and elsewhere herein) may also benefit from being mounted to the gas turbine engine via the anti-vibration mounts, through being mounted on the electrical raft. For example, the reduced vibration may help to preserve the electrical contact between the electrical raft and any electrical unit connected thereto. As such, any components (such as an electrical unit mounted to the electrical raft) that would conventionally be mounted directly to the gas turbine engine and require at least a degree of vibration isolation no longer require their own dedicated anti-vibration mount. Thus, the total number of anti-vibration mounts that are required to assemble an engine may be reduced. This may reduce the number of parts required and/or the time taken to assemble an engine or engine installation and/or reduce the total assembled weight and/or reduce the likelihood of errors occurring during assembly.

Furthermore, components that are conventionally mounted to an engine without anti-vibration mounts (for example because of the weight and/or cost penalty), but which are now mounted to an electrical raft (for example to a mounting surface of the electrical raft), may benefit from vibration isolation without any weight/cost/assembly time penalty. This may reduce the possibility of damage occurring to such components and/or increase their service life. Such components may include, for example, ignitor boxes (used to provide high voltage power to engine ignitors), and pressure sensors/switches, for example for fluid systems such as oil, air, fuel, pneumatics and/or hydraulics.

Further optional features of the invention are set out below.

BRIEF DESCRIPTION OF THE DRAWINGS

Embodiments of the invention will now be described by way of example with reference to the accompanying drawings in which.

DETAILED DESCRIPTION OF THE PREFERRED EMBODIMENTS

Figure 1:
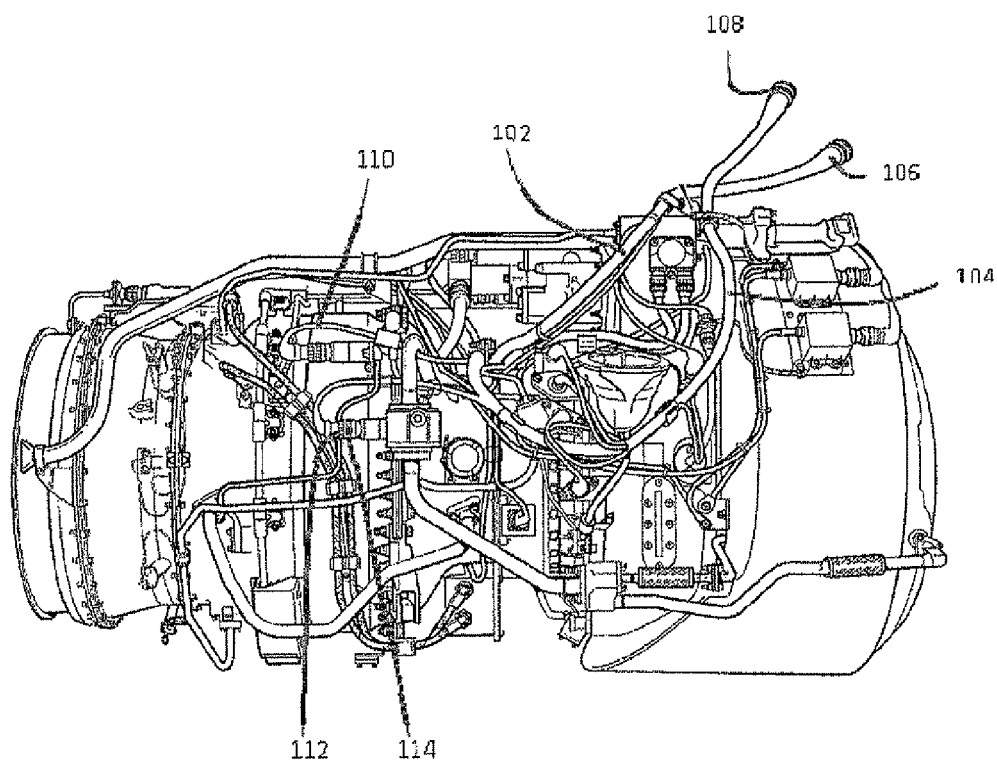
FIG. 1 shows a gas turbine engine with a conventional harness.
Figure 2:
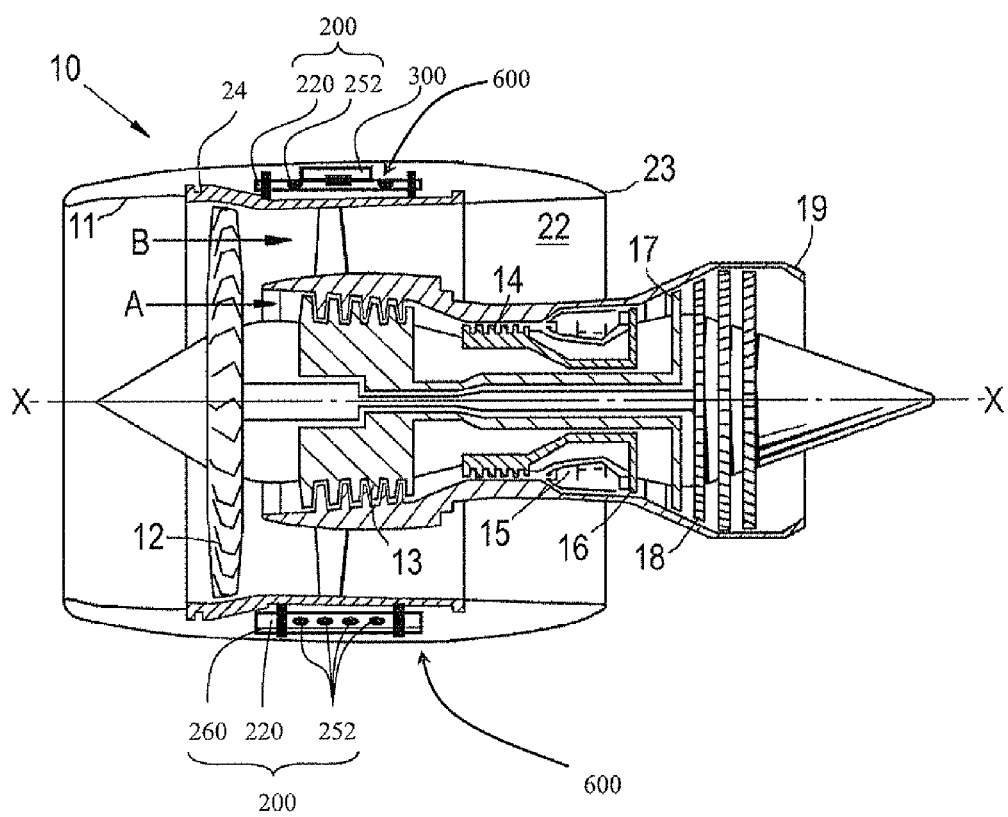
FIG. 2 shows a cross-section through a gas turbine engine having an electrical raft assembly in accordance with aspects of the present invention.

With reference to FIG. 2, a ducted fan gas turbine engine generally indicated at 10 has a principal and rotational axis X-X. The engine 10 comprises, in axial flow series, an air intake 11, a propulsive fan 12, an intermediate pressure compressor 13, a high-pressure compressor 14, combustion equipment 15, a high-pressure turbine 16, and intermediate pressure turbine 17, a low-pressure turbine 18 and a core engine exhaust nozzle 19. The engine also has a bypass duct 22 and a bypass exhaust nozzle 23.

The gas turbine engine 10 works in a conventional manner so that air entering the intake 11 is accelerated by the fan 12 to produce two air flows: a first air flow A into the intermediate pressure compressor 13 and a second air flow B which passes through the bypass duct 22 to provide propulsive thrust. The intermediate pressure compressor 13 compresses the air flow A directed into it before delivering that air to the high pressure compressor 14 where further compression takes place.

The compressed air exhausted from the high-pressure compressor 14 is directed into the combustion equipment 15 where it is mixed with fuel and the mixture combusted. The resultant hot combustion products then expand through, and thereby drive the high, intermediate and low-pressure turbines 16, 17, 18 before being exhausted through the nozzle 19 to provide additional propulsive thrust. The high, intermediate and low-pressure turbines 16, 17, 18 respectively drive the high and intermediate pressure compressors 14, 13 and the fan 12 by suitable interconnecting shafts.

The gas turbine engine 10 shown in FIG. 2 shows two electrical raft assemblies 600 according to the invention. As such, the gas turbine engine 10 is in accordance with the present invention. Each electrical raft assembly 600 comprises an electrical raft 200. The electrical rafts 200 may be used to transmit/transfer electrical signals (or electricity, including electrical power and/or electrical control signals) around the engine and/or to/from the engine 10 from other components, such as components of an airframe. The function and/or construction of each electrical raft 200 and electrical raft assembly 600 may be as described above and elsewhere herein.

In FIG. 2, each electrical raft 200 (which may be referred to herein simply as a raft 200 or an electrical harness raft 200) comprises at least one electrical conductor 252 embedded in a rigid material 220, which may be a rigid composite material.

The electrical conductors 252 in the electrical raft 200 may be provided in a harness 250, which may be a flexible printed circuit board (or FPC) 250.

Figure 3:
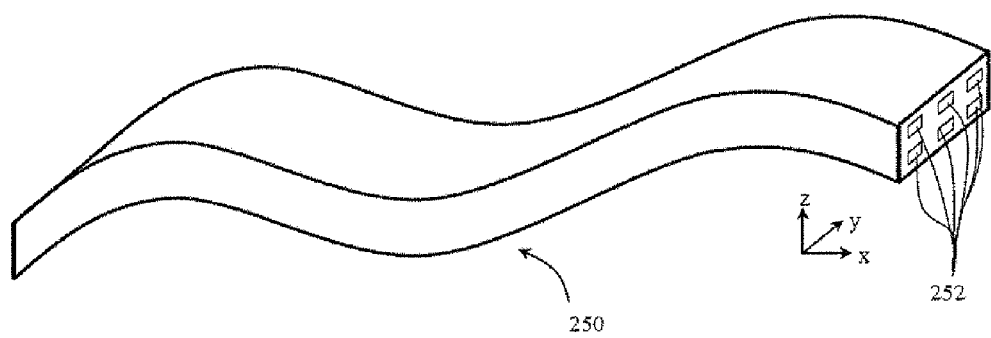
FIG. 3 shows a perspective view of a flexible printed circuit.
Figure 4:
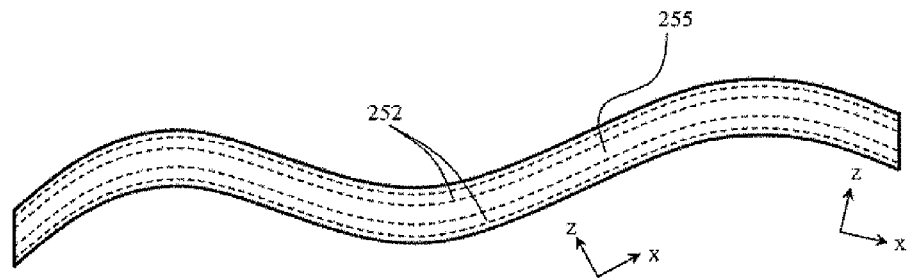
FIG. 4 shows a side view of the flexible printed circuit of FIG. 3.

An example of an FPC 250 in which the electrical conductors 252 may be provided is shown in greater detail in FIGS. 3 and 4. FIG. 3 shows a perspective view of the FPC 250, and FIG. 4 shows a side view.

Such an FPC 250 may comprise a flexible (for example elastically deformable) substrate 255 with conductive tracks 252 laid/formed therein. The FPC 250 may thus be deformable. The FPC 250 may be described as a thin, elongate member and/or as a sheet-like member. Such a thin, elongate member may have a major surface defined by a length and a width, and a thickness normal to the major surface. In the example shown in FIGS. 3 and 4, the FPC 250 may extend along a length in the x-direction, a width in the y-direction, and a thickness (or depth or height) in the z-direction. The x-direction may be defined as the axial direction of the FPC. Thus, the x-direction (and thus the z-direction) may change along the length of the FPC 250 as the FPC is deformed. This is illustrated in FIG. 4. The x-y surface(s) (i.e. the surfaces formed by the x and y directions) may be said to be the major surface(s) of the FPC 250. In the example shown in FIGS. 3 and 3, the FPC 250 is deformable at least in the z direction, i.e. in a direction perpendicular to the major surface. FPCs may be additionally of alternatively deformable about any other direction, and/or may be twisted about any one or more of the x, y, or z directions.

The flexible substrate 255 may be a dielectric. The substrate material may be, by way of example only, polyamide. As will be readily apparent, other suitable substrate material could alternatively be used.

The conductive tracks 252, which may be surrounded by the substrate 255, may be formed using any suitable conductive material, such as, by way of example only, copper, copper alloy, tin-plated copper (or tin-plated copper alloy), silver-plated copper (or silver-plated copper alloy), nickel-plated copper (or nickel-plated copper alloy) although other materials could alternatively be used. The conductive tracks 252 may be used to conduct/transfer electrical signals (including electrical power and electrical control signals) through the rigid raft assembly (or assemblies) 200, for example around a gas turbine engine 10 and/or to/from components of a gas turbine engine and/or an airframe attached to a gas turbine engine.

The size (for example the cross-sectional area) and/or the shape of the conductive tracks 252 may depend on the signal(s) to be transmitted through the particular conductive track 252. Thus, the shape and/or size of the individual conductive tracks 252 may or may not be uniform in a FPC 250.

The example shown in FIGS. 3 and 4 has six conductive tracks 252 running through the substrate 255. However, the number of conductive tracks 252 running through a substrate 255 could be fewer than six, or greater than six, for example tens or hundreds of tracks, as required. As such, many electrical signals and/or power transmission lines may be incorporated into a single FPC 250.

A single FPC 250 may comprise one layer of tracks, or more than one layer of tracks, for example, 2, 3, 4, 5, 6, 7, 8, 9, 10 or more than 10 layers of tracks. An FPC may comprise significantly more than 10 layers of tracks, for example at least an order of magnitude more layers of tracks. In this regard, a layer of tracks may be defined as being a series of tracks that extend in the same x-y surface. Thus, the example shown in FIGS. 3 and 4 comprises 2 layers of tracks, with each layer comprising 3 tracks 252.

An electrical raft 200 may be manufactured using any suitable method. For example, the rigid material 220 may initially be provided as layers of flexible material, such as (by way of example only) layers of fibre and resin compound. This flexible material may be placed into a mould, for example having a desired shape. Other components (such as fluid pipes 210 and/or the electrical conductors 252, which may be embedded in a FPC 250) may also be placed into the mould, for example between layers of the flexible material from which the rigid material 220 is ultimately formed. Parts of the mould may have any suitable form and/or construction, for example that could be readily removed when the electrical raft 200 is formed into the desired shape.

Figure 5:
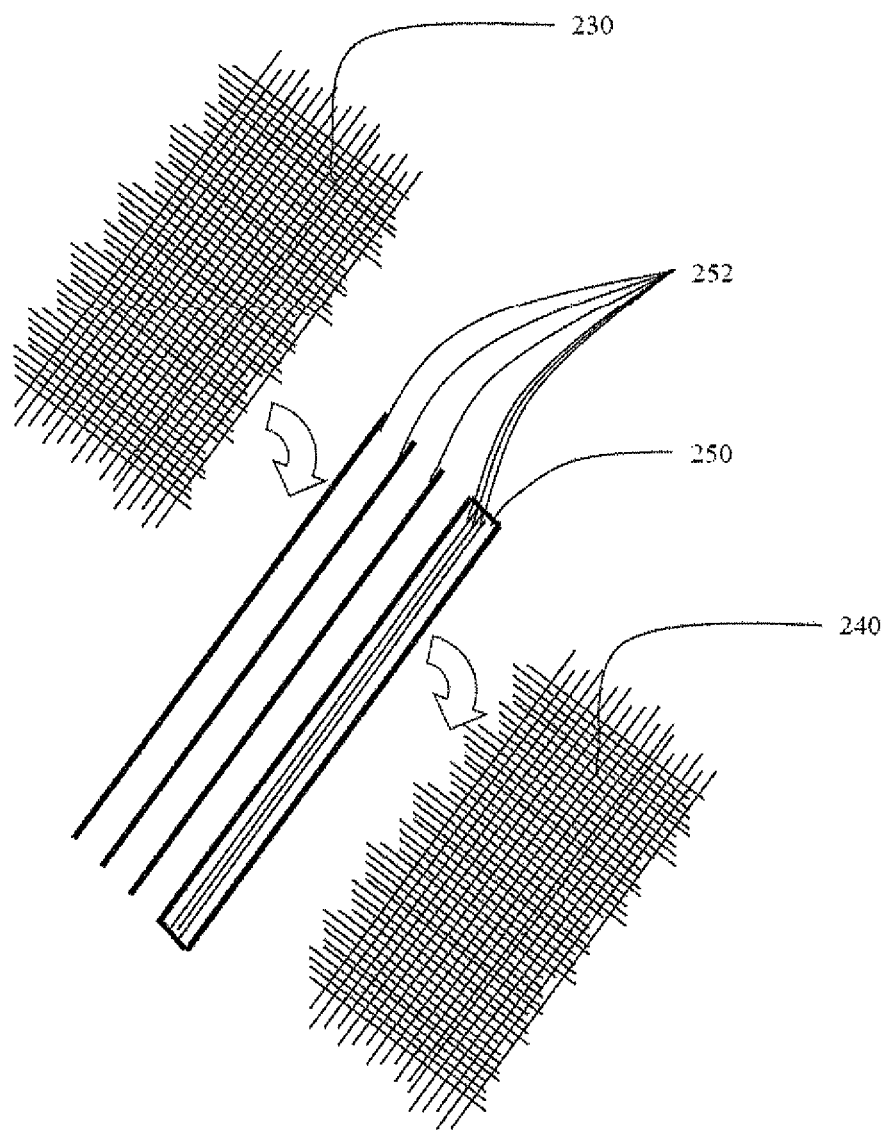
FIG. 5 shows a schematic of an electrical raft prior to assembly.

FIG. 5 shows components of an example of an electrical raft 200 prior to one method of construction. The electrical conductors 252 are provided between two layers of material 230, 240 that, after construction, form the rigid material 220. Some of the electrical conductors 252 are provided in an FPC 250. The material 230, 240 may be a fibre and resin compound, as described elsewhere herein. Such a fibre and resin compound may, after suitable treatment (for example heat treatment), produce the rigid composite material 220. In the example of FIG. 5, the fibre and resin compound is formed of a sheet of interwoven fibres, or strands. The strands in FIG. 5 extend in perpendicular directions, although the strands may extend in any one or more directions as required. The strands/fibres may be pre-impregnated (or "pre-pregged") with the resin.

Prior to any treatment, both the first and second layers 230, 240 and the electrical conductors 252 may be flexible, for example supple, pliable or malleable. As such, when the layers 230, 240 and the electrical conductors 252 are placed together, they may be moulded, or formed, into any desired shape. For example, the layers 230, 240 and the electrical conductors 252 may be placed into a mould (which may be of any suitable form, such as a glass or an aluminium mould) having the desired shape. The desired shape may be, for example, a shape that corresponds to (for example is offset from) a part of a gas turbine engine, such as, by way of example only, at least a part of a casing, such as an engine fan casing or engine core casing. This may enable the final raft to adopt shapes that are curved in two-dimensions or three-dimensions.

Any suitable method could be used to produce the electrical raft 200. For example, the strands/fibres need not be pre-impregnated with the resin. Instead, the fibres/strands could be put into position (for example relative to electrical conductors 252/FPC 250) in a dry state, and then the resin could be fed (or pumped) into the mould. Such a process may be referred to as a resin transfer method. In some constructions no fibre may be used at all in the rigid material 220.

The manufactured electrical raft 200 may be shaped so as to accommodate, or at least in part form, one or more of the cooling passages 706, 806, 906 as described herein. Such a shape may be formed using any suitable method, for example by using a suitably shaped mould.

Figure 6:
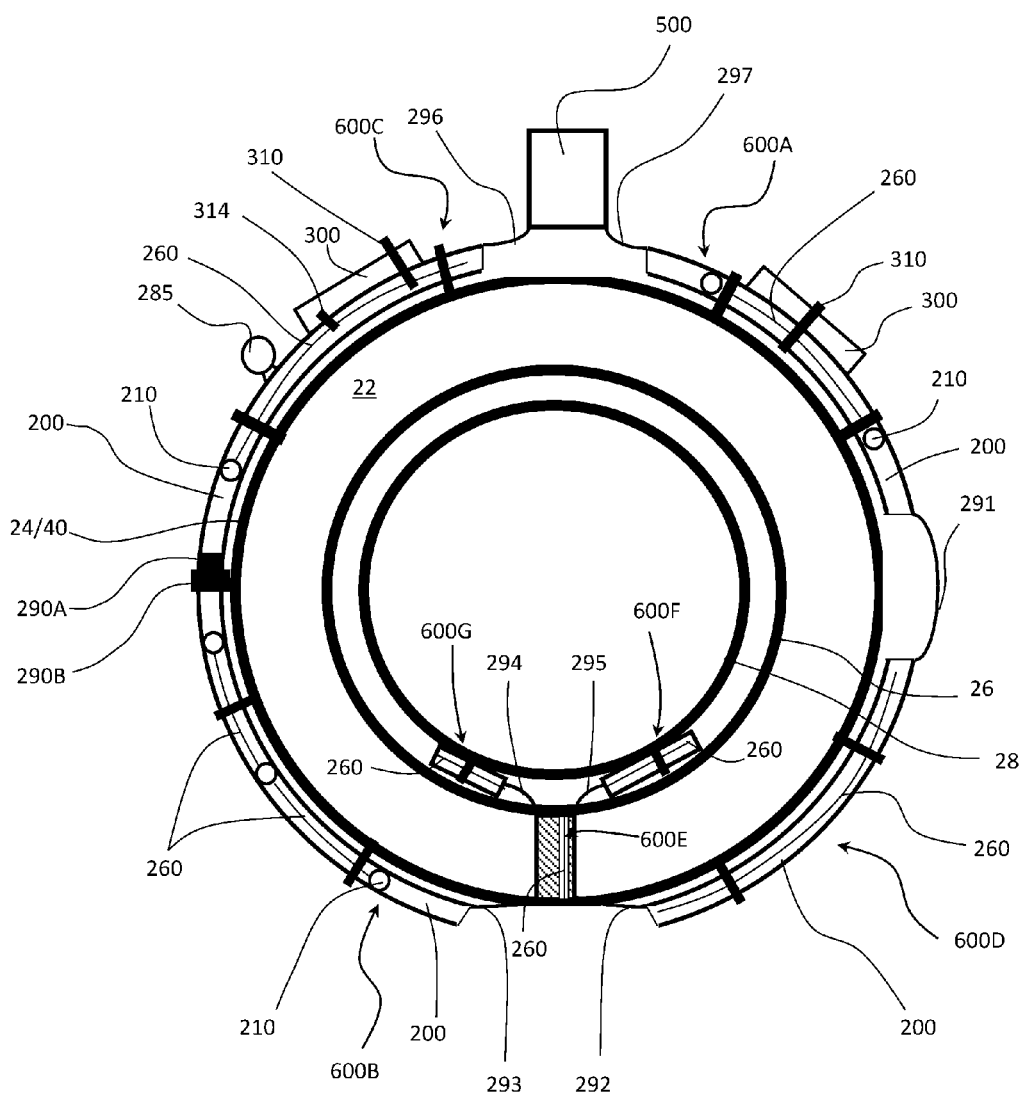
FIG. 6 shows a cross-section normal to the axial direction through a gas turbine engine having an electrical raft assembly in accordance with the present invention.

FIG. 6 is a schematic showing a cross-section perpendicular to the direction X-X of a gas turbine engine comprising electrical raft assemblies 600A-6000. Any one of the electrical raft assemblies 600A-600G may comprise any or all of the features of an electrical raft assembly 600 as described above, for example. Thus, for example, any one of the electrical raft assemblies may comprise an electrical raft 200 (not labelled for raft assemblies 600E-600G for simplicity only) having electrical conductors 252 (not labelled in FIG. 6 for simplicity only) embedded therein. Some or all of the electrical raft assemblies 600A-600G (which may collectively be referred to as electrical raft assemblies 600) comprise a mounting fixture for attaching the respective assembly 600 to a mounting structure.

The mounting structure is part of a fan case 24 for electrical raft assemblies 600A-600D, part of a bifurcation splitter that radially crosses a bypass duct 22 for electrical raft assemblies 600E and part of an engine core case 28 for electrical raft assemblies 600F and 600G. However, it will be appreciated that an electrical raft assembly 600 could be mounted in any suitable and/or desired location on a gas turbine engine.

In FIG. 6, two electrical raft assemblies 600A, 600C are shown as having an electrical unit 300 mounted on the respective electrical raft 200. However, any (or none) of the electrical raft assemblies 600A-600G may have an electrical unit 300 mounted to the respective electrical raft 200.

As mentioned herein, each of the electrical rafts 200 associated with the electrical raft assemblies 600A-600G shown in FIG. 6 comprises one or more electrical conductors 252 embedded therein. However, any one or more of the electrical rafts 200 may be replaced with a raft that does not comprise electrical conductors 252. Such a raft would not be an electrical raft 200, but may otherwise be as described elsewhere herein, for example it may be a rigid raft that may have components/systems (such as, by way of example only, fluid systems, such as pipes) mounted thereon and/or embedded therein. Thus, for example, a gas turbine engine in accordance with the present invention may have a combination of electrical rafts 200 and non-electrical rafts.

The arrangement of electrical raft assemblies 600A-600G shown in FIG. 6 is by way of example only. Alternative arrangements, for example in terms of number, size, shape and/or positioning, of electrical raft assemblies 600A-600G may be used. For example, there need not be seven electrical raft assemblies, the assemblies may or may not be connected together, and the rafts could be provided to (for example mounted on) any one or more components of the gas turbine engine. Purely by way of example only, connection between electrical raft assemblies 600A-600D mounted on the fan casing 24 to the electrical raft assemblies 600F, 600G mounted on the core casing 28 may be provided at least in part by means other than an additional electrical raft assembly 600E, for example using wire conductors with insulating sleeves. By way of further example, one or more electrical raft assemblies 600 may additionally or alternatively be provided to the nose cone, structural frames or elements within the engine (such as "A-frames"), the nacelle, the fan cowl doors, and/or any connector or mount between the gas turbine engine 10 and a connected structure (which may be at least a part of a structure in which the gas turbine engine 10 is installed), such as the pylon 500 between the gas turbine engine 10 and an airframe (not shown).

Any one or more of the electrical rafts of the electrical raft assemblies 600A-600G may have a fluid passage 210 embedded therein and/or provided thereto. The fluid passage 210 may be part of a fluid system, such as a gas (for example pneumatic or cooling gas/air) and/or liquid (for example a fuel, hydraulic and/or lubricant liquid). The fluid passage 210 may be in addition to the integral cooling passage 706, 806, 906 described below in relation to FIGS. 7 to 16, or may form at least a part of those integral cooling passages. In the FIG. 6 example, three of the electrical rafts (of electrical raft assemblies 600A, 600B, 600C) comprise a fluid passage 210 at least partially embedded therein. The electrical raft of assembly 600C also has a fluid passage 285 (which may be for any fluid, such as those listed above in relation to embedded passage 210) mounted thereon. Such a mounted fluid passage 285 may be provided to any electrical raft, such as those of electrical raft assemblies 600A-600G shown in FIG. 6. The fluid passages 210, 285 shown in FIG. 6 may be oriented in an axial direction of the engine 10. However, fluid passages may be oriented in any direction, for example axial, radial, circumferential or a combination thereof.

Any of the electrical raft assemblies 600A-600G (or the respective electrical rafts 200 thereof) may have any combination of mechanical, electrical and/or fluid connections to one or more (for example 2, 3, 4, 5 or more than 5) other components/systems of the gas turbine engine 10 and/or the rest of the gas turbine engine 10. Examples of such connections are shown in FIG. 6, and described below, but other connectors may be used. For example, electrical raft assemblies 600 (and/or non-electrical rafts) may be connected together (or to other components) using any combination of electrical, fluid and/or mechanical connectors. Thus, any of the connections 290A/290B, 291-297 shown in FIG. 6 may be any combination of electrical, fluid and/or mechanical connection. Alternatively, electrical raft assemblies 600 (and/or non-electrical rafts) may be standalone, and thus may have no connection to other rafts or components.

A connection 291 is shown between the electrical rafts of the assemblies 600A and 600D. The connection 291 may comprise an electrical connection. Such an electrical connection may be flexible and may, for example, take the form of a flexible printed circuit such as the flexible printed circuit 250 shown in FIGS. 3 and 4. Such a flexible electrical connection may be used to electrically connect any electrical raft assembly 600 to any other component, such as another electrical raft assembly 600. A connection 297 (which may be or comprise an electrical connection) is provided between the electrical raft of the assembly 600A and a part of an airframe, or airframe installation 500, which may, for example, be a pylon. Similarly, a fluid and/or mechanical connection 296 may additionally or alternatively be provided between the airframe 500 and another electrical raft of the assembly 600C. As shown in FIG. 6, other electrical and/or fluid connections 292, 293, 294, 295 may be provided between electrical rafts 200 (or assemblies 600) and other components, such as other electrical rafts 200 (or assemblies 600).

A direct connection 290A, 290B may be provided, as shown for example between the electrical rafts of the assemblies 600B and 600C in the FIG. 6 arrangement. Such a direct connection 290A, 290B may comprise a connector 290A provided on (for example embedded in) one electrical raft 200 connected to a complimentary connector 290B provided on (for example embedded in) another electrical raft 200. Such a direct connection 290A, 290B may, for example, provide fluid and/or electrical connection between the two electrical rafts assemblies 600B, 600C.

An electrical raft 200 may comprise an electrically conductive grounding or screen layer 260, as shown in the electrical rafts 200 shown in FIG. 6. However, it will be appreciated that electrical rafts 200 according to the invention and/or for use with the invention need not have such an electrically conductive grounding or screen layer 260. Where an electrically conductive grounding or screen layer 260 is present, an electrically conductive fastener 310 may be used to fasten, or fix, the electrical unit 300 (where present) to the electrical raft 200. This may allow the electrical unit 300 to be electrically grounded. It will also be appreciated, however, that electrical rafts 200 according to the invention and/or for use with the invention need not have such an electrically conductive fastener 310. FIG. 6 also shows an electrical connector that is embedded in the rigid material of the raft 200 and connected to the embedded electrical conductors. The electrical connector 314 directly electrically connects the electronic control unit 300 to the electrical conductors embedded in the rigid material. In FIGS. 7-16, the electrical conductor may correspond to the features labeled 714, 814, 914.

Although the detailed construction of the electrical raft assemblies 600 is not shown in FIG. 6, any one or more of the electrical raft assemblies 600 may be in accordance with the present invention, for example as described below in relation to FIGS. 7 to 16.

It will be appreciated that many alternative configurations and/or arrangements of electrical raft assemblies 600 and gas turbine engines 10 comprising electrical raft assemblies 600 other than those described herein may fall within the scope of the invention. For example, alternative arrangements of electrical raft assemblies 600 (for example in terms of the arrangement, including number/shape/positioning/ constructions, of mounting fixtures, the arrangement/shape/ positioning/construction of the electrical rafts 200, the type and/or positioning of components (if any) mounted to/embedded in the electrical rafts 200, the rigid material 220 and the electrical conductors 252) may fall within the scope of the invention and may be readily apparent to the skilled person from the disclosure provided herein. Alternative arrangements of connections (for example mechanical, electrical and/or fluid) between the electrical (or non-electrical) rafts and/or raft assemblies and between the electrical (or non-electrical) rafts or raft assemblies and other components may fall within the scope of the invention and may be readily apparent to the skilled person from the disclosure provided herein. Furthermore, any feature described and/or claimed herein may be combined with any other compatible feature described in relation to the same or another embodiment.

Figure 7:
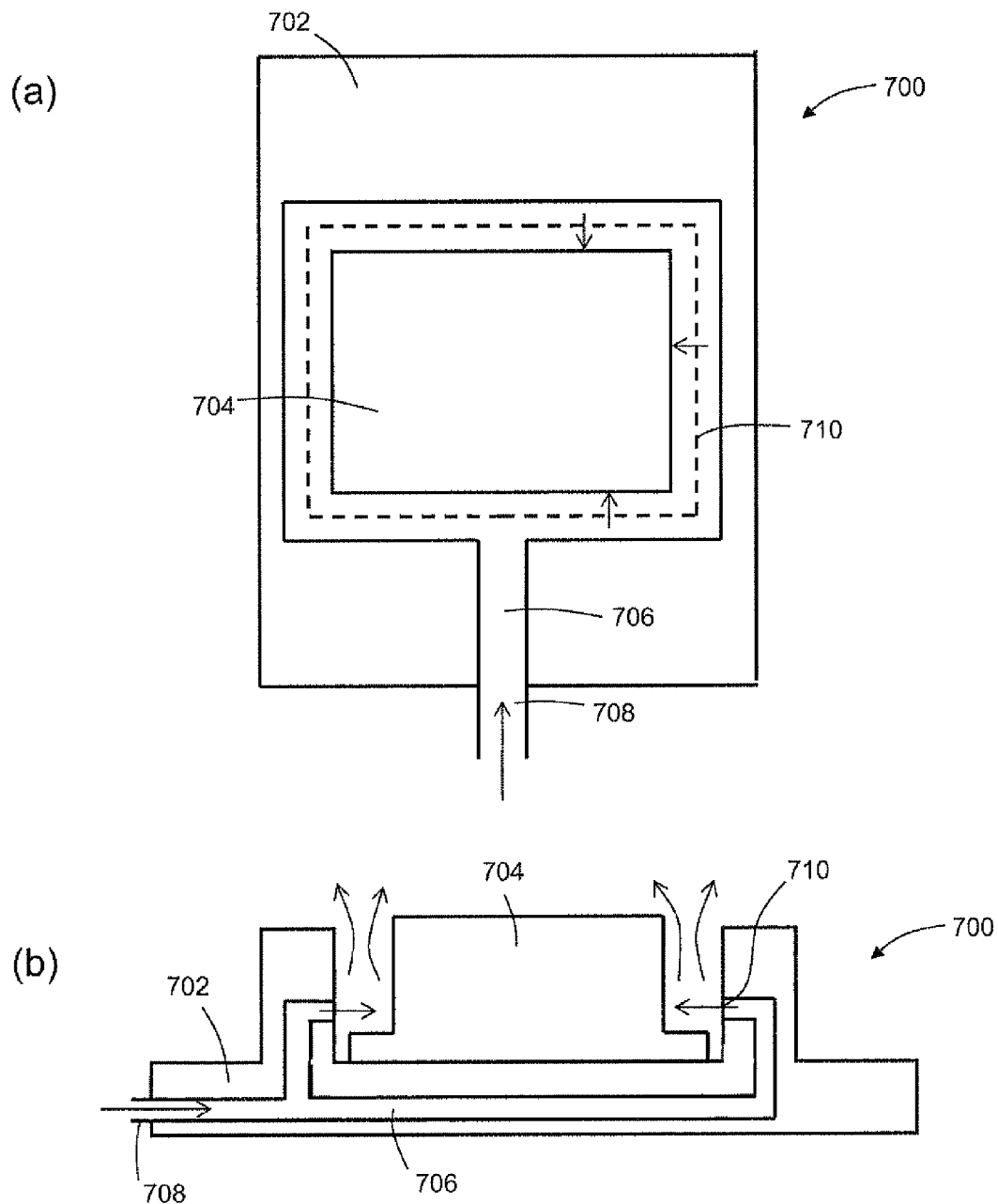
FIG. 7 shows schematically (a) a plan view of an embodiment of an electrical raft assembly in accordance with the present invention, and (b) a cross-section through the assembly.

FIG. 7 shows schematically (a) a plan view of an embodiment of an electrical raft assembly 700 in accordance with the present invention, and (b) a cross-section through the assembly. The raft assembly may have the position, structure and features of any one of the raft assemblies described above in relation to FIGS. 2 to 6. The assembly has a rigid electrical raft 702 which includes an electrical system comprising electrical conductors (not shown) embedded in the rigid material of the raft. An electrical component 704 is located in a recess formed in the electrical raft. The electrical raft includes an integral cooling passage 706 which guides a flow of air (indicated by arrows) through the raft to cool the engine component. The passage is formed from the material of the raft. The passage has an entrance hole 708 which receives the cooling air. The passage extends to beneath the base of the component 704 and around the side walls of the component. From the side wall positions, the cooling air exits the passage through an array of impingement holes 710 to form cooling jets which impinge on the side surfaces of the component. The air then bleeds out, for example, into a ventilated fire zone.

Figure 8:
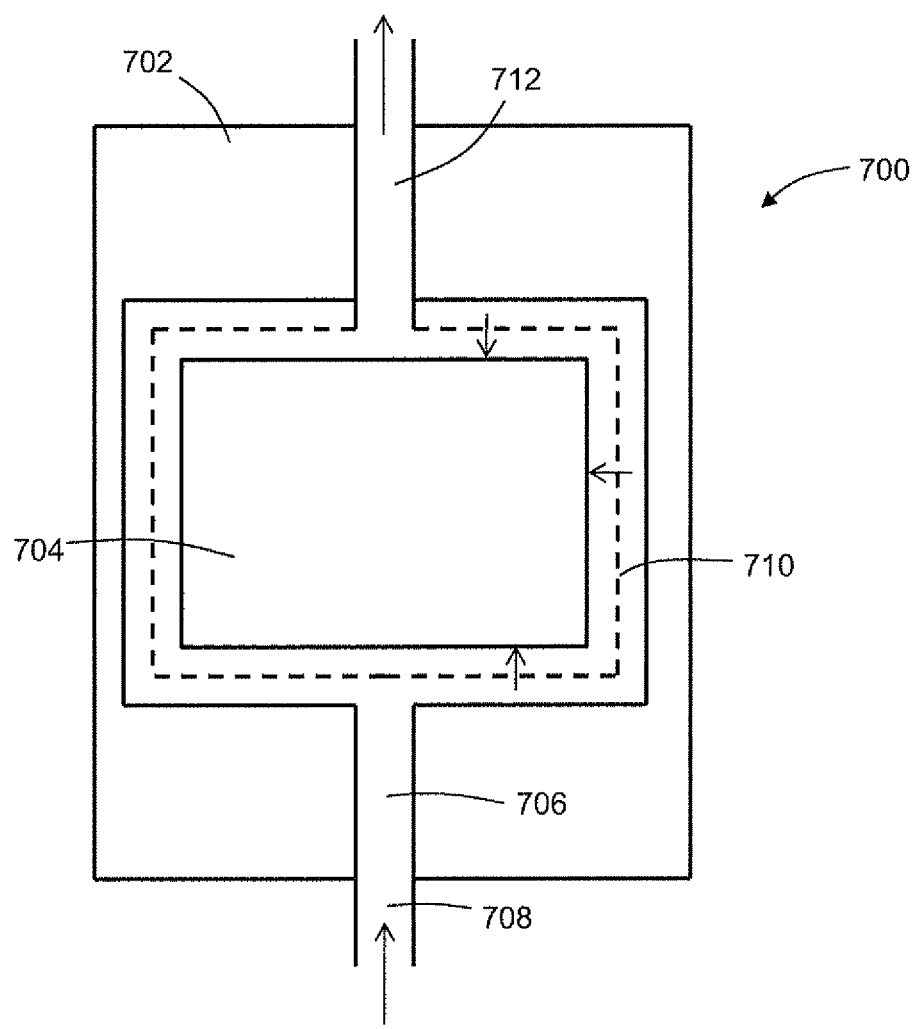
FIG. 8 shows schematically a plan view of a variant of the electrical raft assembly of FIG. 7.

FIG. 8 shows schematically a plan view of a variant of the electrical raft assembly 700 in which the cooling air, after impinging as jets on the side surfaces of the component 704, is collected and fed to an exit port 712 of the passage 706. The cooling air may then, for example, be directed on to another raft assembly, electrical component or to a zone exit.

Figure 9:
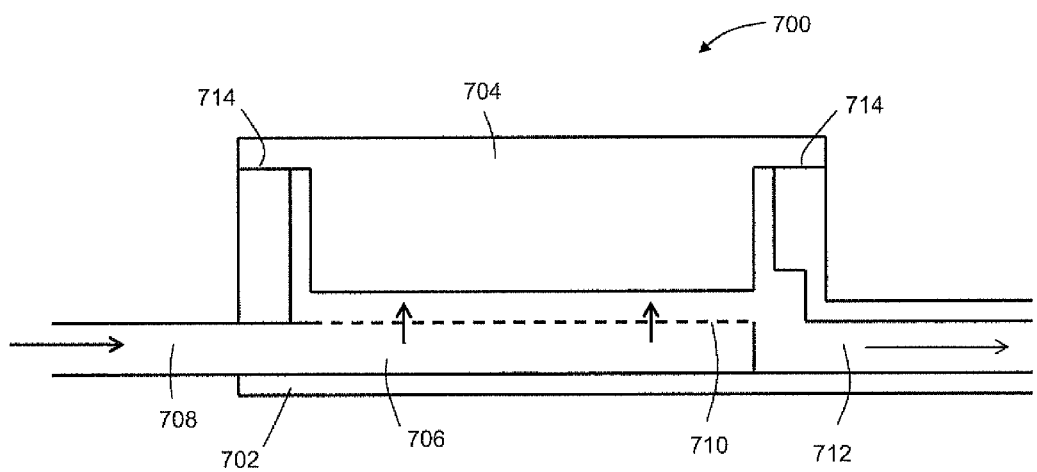
FIG. 9 shows schematically a cross-section of another variant of the electrical raft assembly of FIG. 7.

FIG. 9 shows schematically a cross-section through another variant of the electrical raft assembly 700 in which the array of impingement holes 710 is at the base of the component 704. This variant allows an electrical connection 714 between the component and the electrical conductors of the raft 702 to be made at the sides of the component.

Figure 10:
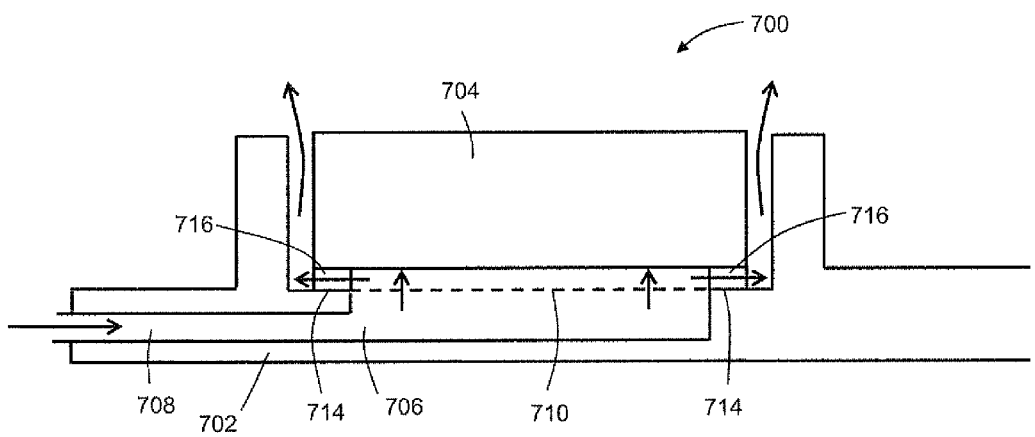
FIG. 10 shows schematically a cross-section of another variant of the electrical raft assembly of FIG. 7.

FIG. 10 shows schematically a cross-section through another variant of the electrical raft assembly 700 in which the array of impingement holes 710 is at the base of the component 704. In this case, the electrical connection 714 between the component and the electrical conductors of the raft 702 is made via a one or more feet 716 at the base of the component.

Figure 11:
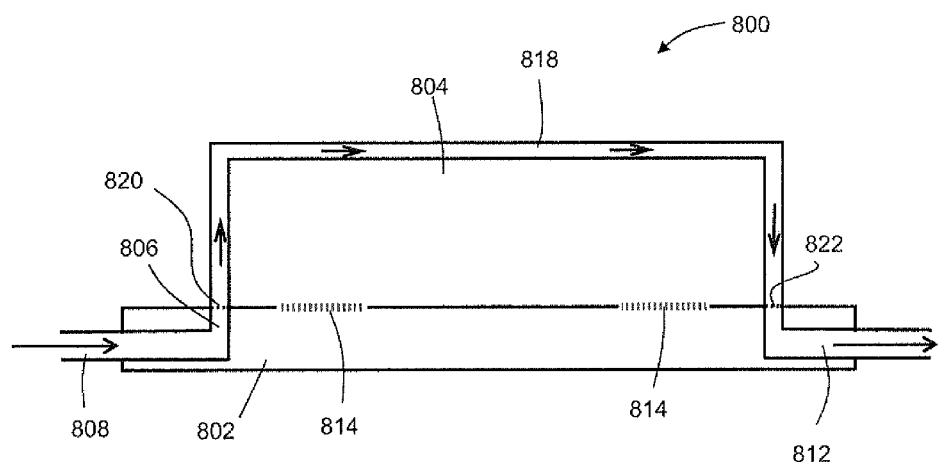
FIG. 11 shows schematically a cross-section through a further embodiment of an electrical raft assembly in accordance with the present invention.

FIG. 11 shows schematically a cross-section through a further embodiment of an electrical raft assembly 800 in accordance with the present invention. Again, the raft assembly may have the position, structure and features of any one of the raft assemblies described above in relation to FIGS. 2 to 6. The assembly has a rigid electrical raft 802 which includes an electrical system comprising electrical conductors (not shown) embedded in the rigid material of the raft. An electrical component 804 is mounted to the raft. Electrical connections 814 between the component and the electrical conductors of the raft are made at the base of the component. The side and top surfaces of the component are in the form of a double-walled housing 818, with a cavity between the two walls of the housing. The electrical raft includes an integral cooling passage 806 which guides a flow of air (indicated by arrows) through the raft to cool the engine component. The passage is formed from the material of the raft. The passage has an entrance hole 808 which receives the cooling air. The passage has a port 820 which docks to a corresponding inlet port of the double-walled housing. The air from the passage thus flows through the housing to cool the component. After flowing through the housing, the cooling air is collected and fed back into the passage at the other side of the component at a port 822 of the passage which docks to a further corresponding outlet port of the housing. The air then flows on to an exit port 812 of the passage and may then be used, for example, for piping on to another raft assembly, electrical component or to a zone exit.

Figure 12:
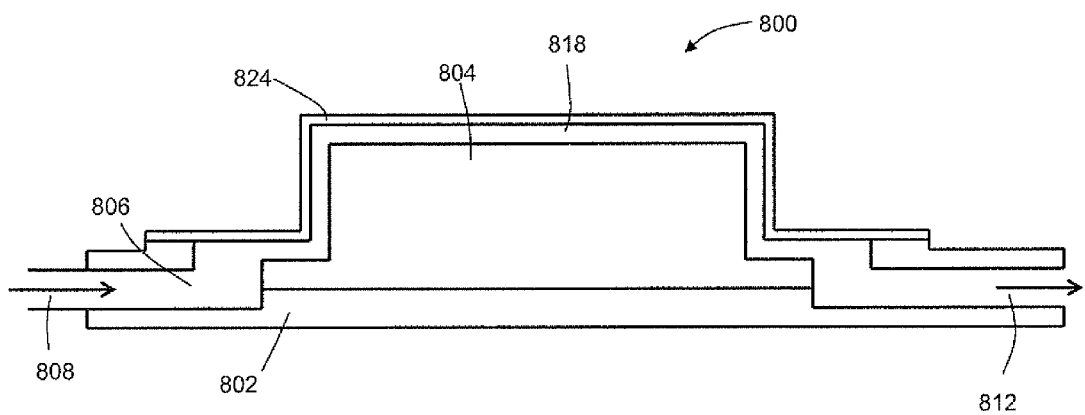
FIG. 12 shows schematically a cross-section of a variant of the electrical raft assembly of FIG. 11.

FIG. 12 shows schematically a cross-section of a variant of the electrical raft assembly 800 in which the outer wall of the housing 818 is formed by a removably replaceable lid 824. The separate lid facilitates access to the component 814.

Figure 13:
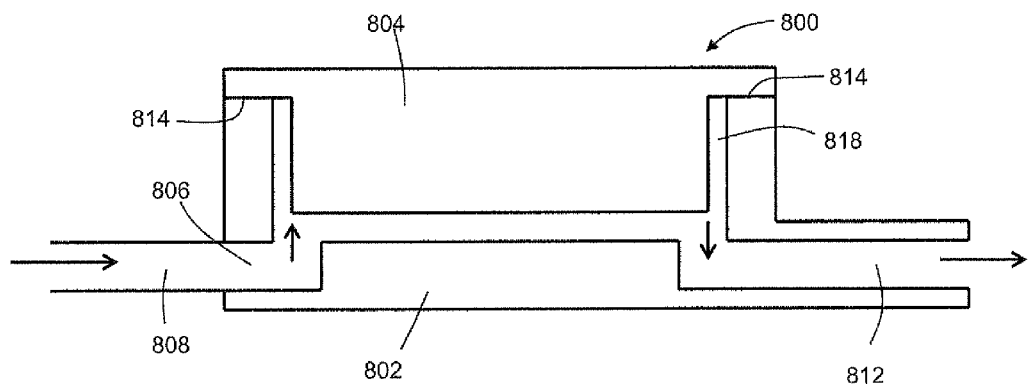
FIG. 13 shows schematically a cross-section of another variant of the electrical raft assembly of FIG. 11.

FIG. 13 shows schematically a cross-section of a variant of the electrical raft assembly 800 in which the double-walled housing 818 encircles the side surfaces of the component and covers the base of the component. At the component base, the housing is formed by the bottom surface of the component 814 and a facing surface of the raft 802. The component is located in a recess formed in the raft, and the electrical connections 814 between the component and the electrical conductors of the raft are made around a rim at the entrance of the recess where the component seals to the raft.

Figure 14:
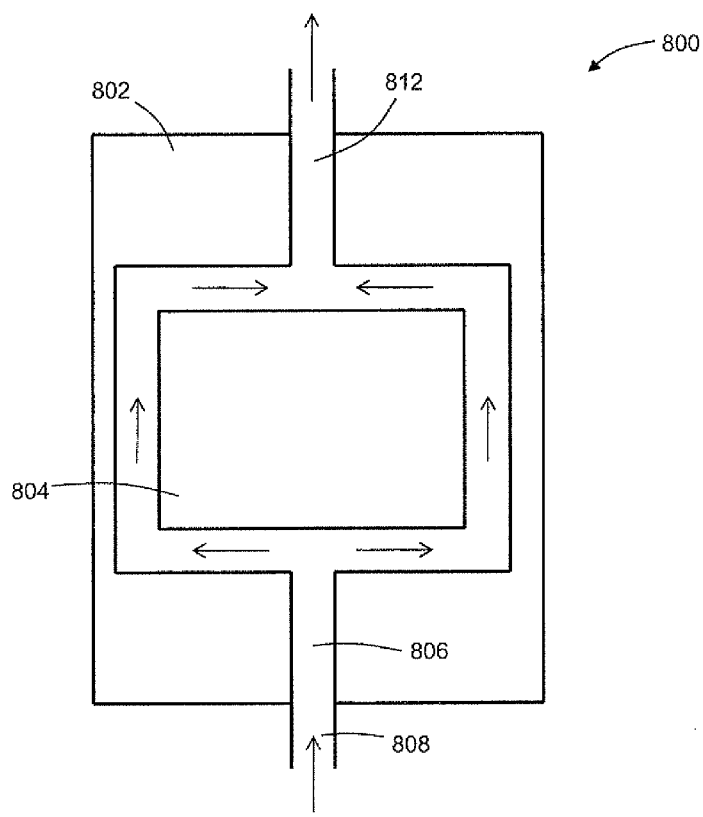
FIG. 14 shows schematically a plan view of the electrical raft assembly of FIG. 11, 12 or 13.

FIG. 14 shows schematically a plan view of the electrical raft assembly 800, and shows how the housing can guide the cooling air around left and right, as well as front and back, side surfaces of the component 814.

Figure 15:
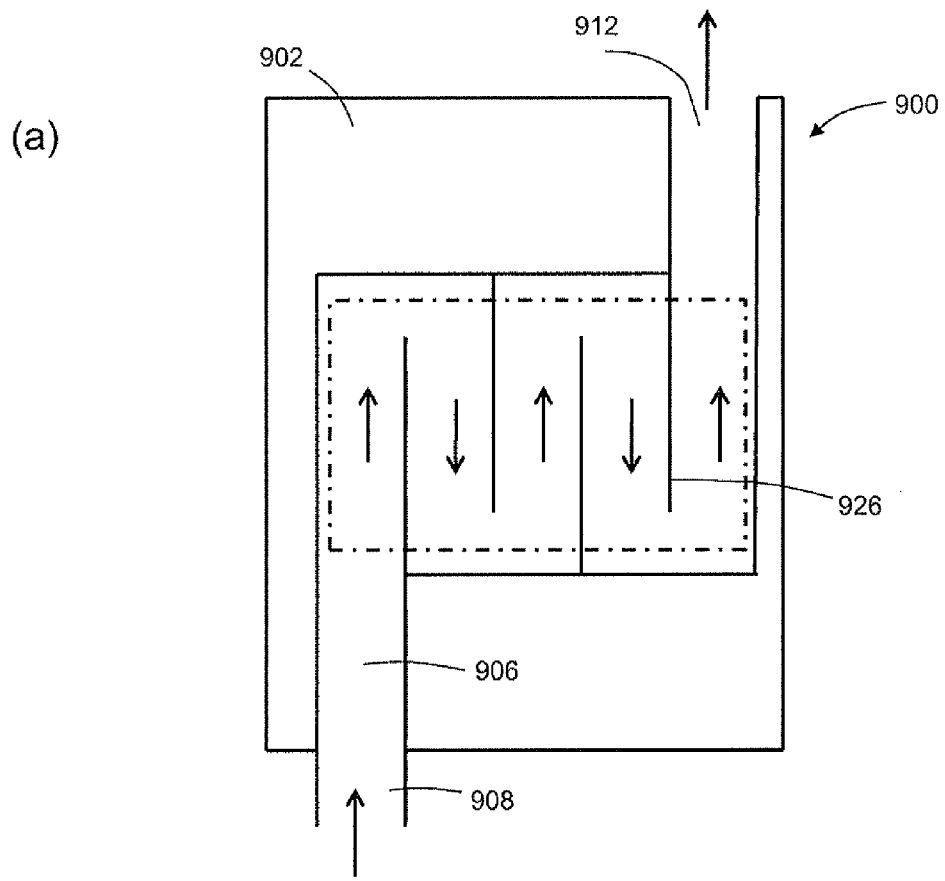
FIG. 15 shows schematically (a) a plan view of a further embodiment of an electrical raft assembly in accordance with the present invention, and (b) a cross-section through the assembly.
Figure 15:
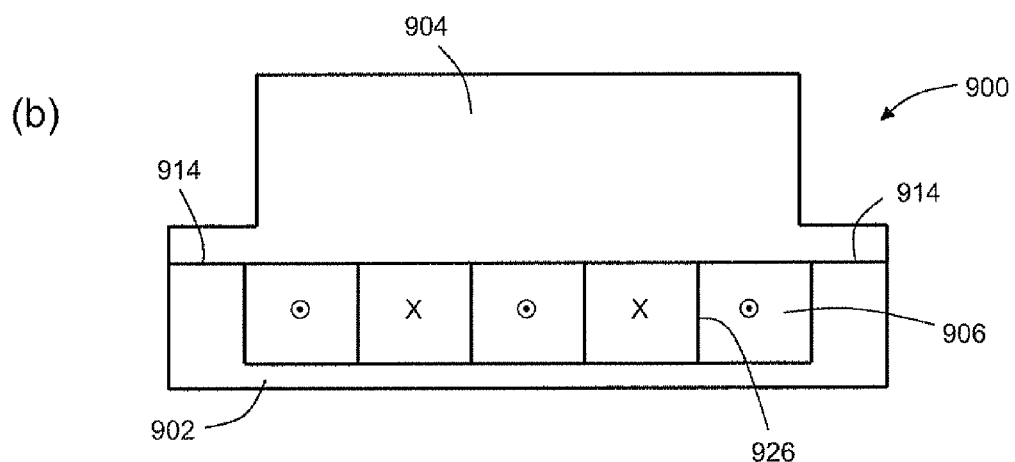

In the embodiment of FIGS. 11 to 14, the cavity of the housing 818 can have internal walls which guide the fluid on a convoluted route through the cavity. However, the concept of using such a convoluted route can be more generally applied. For example, FIG. 15 shows schematically (a) a plan view of a further embodiment of an electrical raft assembly 900 in accordance with the present invention, and (b) a cross-section through the assembly. Again, the raft assembly may have the position, structure and features of any one of the raft assemblies described above in relation to FIGS. 2 to 6. The assembly has a rigid electrical raft 902 which includes an electrical system comprising electrical conductors (not shown) embedded in the rigid material of the raft. An electrical component 904 is mounted to the raft (the footprint of the component is indicated with a dashed-dotted line in FIG. 15(a)). Electrical connections 914 between the component and the electrical conductors of the raft are made towards the edges of the component. The electrical raft includes an integral cooling passage 906 which guides a flow of air (indicated by arrows) through the raft to cool the engine component. The passage is formed from the material of the raft. The passage has an entrance hole 908 which receives the cooling air. Beneath the component, a number of dividing walls 926 in the passage create a convoluted, multi-pass route with multiple successive reversals in flow direction. The multi-pass route increases the amount of heat that can be withdrawn from the component into the cooling air. The cooling air then flows on to an exit port 912 of the passage for piping on to another raft assembly, electrical component or to a zone exit.

Figure 16:
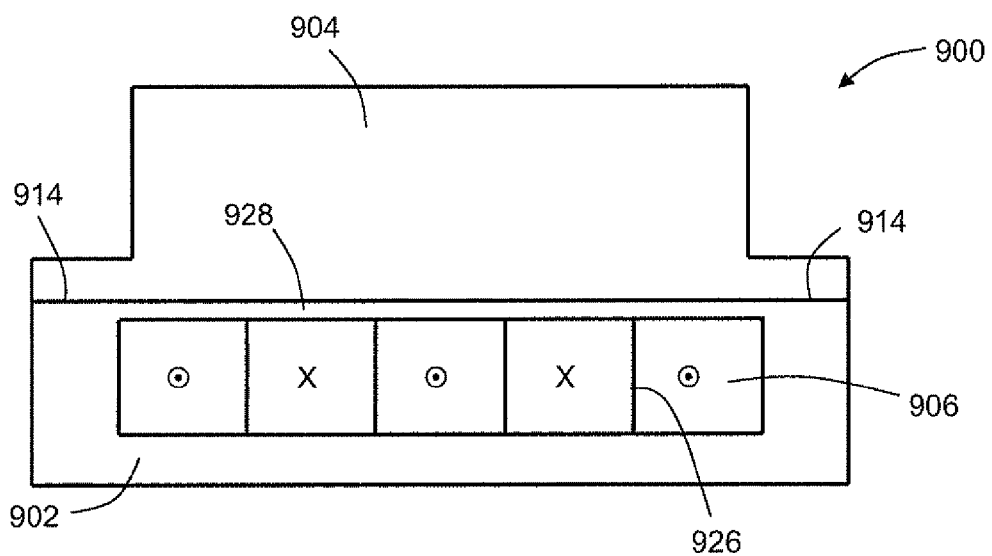
FIG. 16 shows schematically a cross-section of a variant of the electrical raft assembly of FIG. 15.

In the embodiment of FIG. 15, the cooling air makes direct contact with a heat-withdrawing surface of the component 904 in the convoluted part of the passage 906. Another option, however, shown schematically in FIG. 16 is for the heat-withdrawing surface of the engine component to be in intimate, heat-conducting relationship with one side of a wall 928 of the raft, the cooling air in the convoluted part of the passage being in direct contact with the other side of the wall to remove heat from the component via the wall.

In the embodiments of FIGS. 7 to 16, the respective passage entrance hole 708, 808, 908 can receive the cooling air, for example, from an inlet scoop on the outside of the engine nacelle or in the main engine intake, or from engine air bled from the bypass duct or from any of the compressor stages. The respective rigid electrical raft 702, 802, 902 may be formed of rigid composite material. The respective electrical component 704, 804, 904 may be an ECU, such as an EEC or an engine health monitoring unit. The cooling effectiveness can be improved by increasing the surface area of the respective cooling passage 706, 806, 906 e.g. through the use of cooling fins on the walls of the passage. Another possibility is to improve cooling effectiveness by deploying turbulators within the passage.

In the embodiments of FIGS. 7 to 16, the respective rigid electrical raft 702, 802, 902 has only one integral cooling passage 706, 806, 906. However, in other embodiments the raft may have a plurality of such passages, e.g. each serving a different electrical component or more than one serving the same component.

Where reference is made herein to a gas turbine engine, it will be appreciated that this term may include a gas turbine engine/gas turbine engine installation and optionally any peripheral components to which the gas turbine engine may be connected to or interact with and/or any connections/interfaces with surrounding components, which may include, for example, an airframe and/or components thereof. Such connections with an airframe, which are encompassed by the term "gas turbine engine" as used herein, include, but are not limited to, pylons and mountings and their respective connections. The gas turbine engine itself may be any type of gas turbine engine, including, but not limited to, a turbofan (bypass) gas turbine engine, turbojet, turboprop, ramjet, scramjet or open rotor gas turbine engine, and for any application, for example aircraft, industrial, and marine application. Electrical raft assemblies 600 such as any of those described and/or claimed herein may be used as part of any apparatus, such as any vehicle, including land, sea, air and space vehicles, such as motor vehicles (including cars and busses), trains, boats, submarines, aircraft (including aeroplanes and helicopters) and spacecraft (including satellites and launch vehicles).

While the invention has been described in conjunction with the exemplary embodiments described above, many equivalent modifications and variations will be apparent to those skilled in the art when given this disclosure. For example, in the embodiments of FIGS. 7 to 16, air is used as the cooling fluid in an open circuit, but in other embodiments different fluids and/or closed circuits could be used. Accordingly, the exemplary embodiments of the invention set forth above are considered to be illustrative and not limiting. Various changes to the described embodiments may be made without departing from the spirit and scope of the invention.

We claim:

1. A gas turbine engine comprising:
an electrical raft assembly mounted to the gas turbine engine, the electrical raft assembly comprising:
a rigid electrical raft formed of a rigid material that includes an electrical system comprising electrical conductors, embedded in the rigid material, wherein all of the electrical conductors are embedded in the rigid material so as to be surrounded by, and thereby fixed in position by, the rigid material and so that the electrical conductors do not contact each other and are thus spaced apart from each other;
an electrical connector that is embedded in the rigid material and that is connected to at least one of the embedded electrical conductors; and
an electrical control unit (ECU) that is directly mounted to the rigid electrical raft and that is directly electrically connected to the electrical connector embedded in the rigid material so as to be electrically connected to at least one of the embedded electrical conductors, wherein:
the rigid electrical raft includes one or more integral cooling passages which guide a coolant fluid through the rigid electrical raft to cool the ECU; and
the ECU is only mounted to the gas turbine engine via the rigid electrical raft to which the ECU is directly mounted.

2. The gas turbine engine according to claim 1, wherein the one or more integral cooling passages are formed by the rigid material.

3. The gas turbine engine according to claim 1, wherein the rigid material is a rigid composite material.

4. The gas turbine engine according to claim 1, wherein the one or more integral cooling passages feed the coolant fluid to an array of impingement holes formed in the rigid electrical raft, the coolant fluid exiting the array of impingement holes as cooling jets which impinge on one or more surfaces of the ECU.

5. The gas turbine engine according to claim 1, wherein the ECU has a double-walled housing and the one or more integral cooling passages feed the coolant fluid into a cavity formed between two walls of the double-walled housing.

6. The gas turbine engine according to claim 5, wherein an outer wall of the double-walled housing is at least partly formed by a removably replaceable cover to the cavity.

7. The gas turbine engine according to claim 5, wherein the cavity has internal walls which guide the coolant fluid on a convoluted route through the cavity.

8. The gas turbine engine according to claim 1, wherein the one or more integral cooling passages guide the coolant fluid on a convoluted route over a heat-withdrawing surface of the ECU.

9. The gas turbine engine according to claim 8, wherein the heat-withdrawing surface of the ECU has an intimate, heat-conducting relationship with one side of a wall of the rigid electrical raft, the coolant fluid in the convoluted route being in direct contact with a second side of the wall.

10. The gas turbine engine according to claim 1, wherein the one or more integral cooling passages are arranged to guide a flow of cooling air.

11. The gas turbine engine or a gas turbine engine installation, having the electrical raft assembly according to claim 1 mounted to a part thereof, wherein: the part of the gas turbine engine or gas turbine engine installation to which the electrical raft assembly is mounted is different from the ECU that is directly mounted to the rigid electrical raft.

12. The gas turbine engine or the gas turbine engine installation according to claim 11, wherein:
the electrical raft assembly is part of an electrical system of the gas turbine engine; and
the electrical system further comprises a flexible cable electrically connected between the electrical raft assembly and another electronic component that is different than the ECU.

13. The gas turbine engine according to claim 1, wherein the one or more integral cooling passages are configured to cool the ECU.

14. The gas turbine engine according to claim 1, wherein the ECU that is directly mounted to the rigid electrical raft is secured to the rigid electrical raft by electrically conductive fasteners.

15. A gas turbine engine according to claim 1, wherein the embedded electrical conductors are surrounded by the rigid material along their entire length.

* * * * *